(12) United States Patent
Jeon et al.

(10) Patent No.: US 12,165,694 B2
(45) Date of Patent: Dec. 10, 2024

(54) NONVOLATILE MEMORY DEVICE AND OPERATION METHOD THEREOF

(71) Applicant: SAMSUNG ELECTRONICS CO., LTD., Suwon-si (KR)

(72) Inventors: Su Chang Jeon, Suwon-si (KR);
Woohyun Kang, Suwon-si (KR);
Seungkyung Ro, Suwon-si (KR);
Sangkwon Moon, Suwon-si (KR);
Heewon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/223,783

(22) Filed: Jul. 19, 2023

(65) Prior Publication Data

US 2024/0177764 A1    May 30, 2024

(30) Foreign Application Priority Data

Nov. 29, 2022    (KR) .......................... 10-2022-0163261

(51) Int. Cl.
*G06F 3/06*    (2006.01)
*G11C 11/408*  (2006.01)

(52) U.S. Cl.
CPC ........ *G11C 11/4085* (2013.01); *G06F 3/0614* (2013.01); *G06F 3/0658* (2013.01); *G06F 3/0659* (2013.01); *G06F 3/0679* (2013.01); *G11C 11/4087* (2013.01)

(58) Field of Classification Search
None
See application file for complete search history.

(56) References Cited

U.S. PATENT DOCUMENTS

| 8,514,646 | B1 | 8/2013 | Nan |
| 8,611,157 | B2 | 12/2013 | Dutta |
| 9,530,512 | B2 | 12/2016 | Ray et al. |
| 10,535,383 | B2 | 1/2020 | Thalaimalaivanaraj et al. |
| 2012/0134213 | A1* | 5/2012 | Choi ...................... G11C 16/10 365/185.18 |
| 2016/0180946 | A1* | 6/2016 | Hong ..................... G11C 29/76 365/185.11 |

(Continued)

FOREIGN PATENT DOCUMENTS

KR    10-2011-0001580 A    1/2011
KR    10-1868332 B1    6/2018

*Primary Examiner* — Brian R Peugh
(74) *Attorney, Agent, or Firm* — Sughrue Mion, PLLC

(57) ABSTRACT

Disclosed is a nonvolatile memory device which include a memory cell array including a plurality of memory cells connected to a plurality of word lines, an address decoder that controls a selected word line among the plurality of word lines based on an address received from an external device including a first temperature sensor, a second temperature sensor that measures a read temperature of first memory cells connected to the selected word line from among the plurality of memory cells, and a temperature compensation circuit that calculates a read level offset based on the read temperature and a program temperature of the first memory cells measured by the first temperature sensor and generates a compensation read voltage based on the read level offset. The address decoder is further configured to provide the compensation read voltage to the selected word line.

20 Claims, 22 Drawing Sheets

(56) References Cited

U.S. PATENT DOCUMENTS

| | | |
|---|---|---|
| 2017/0053714 A1 | 2/2017 | Guy et al. |
| 2022/0164112 A1* | 5/2022 | Kientz .................. G06F 3/064 |
| 2022/0350718 A1* | 11/2022 | Sheperek ............ G06F 11/1658 |

* cited by examiner

NONVOLATILE MEMORY DEVICE AND OPERATION METHOD THEREOF

CROSS-REFERENCE TO RELATED APPLICATIONS

This application claims priority under 35 U.S.C. § 119 to Korean Patent Application No. 10-2022-0163261 filed on Nov. 29, 2022, in the Korean Intellectual Property Office, the disclosures of which are incorporated by reference herein in their entireties.

BACKGROUND

Embodiments of the present disclosure described herein relate to a semiconductor memory, and more particularly, relate to a nonvolatile memory device and an operation method thereof.

A flash memory device is being widely used as high-capacity storage of a computing system. The flash memory device performs a read operation or a program operation by controlling voltages of a plurality of word lines connected to a plurality of memory cells. In detail, the flash memory device may perform the read operation or the program operation in units of pages sharing the same word line.

The flash memory device may store data based on threshold voltages of memory cells. The data stored in the memory cells may be read by determining the threshold voltages of the memory cells using a read voltage(s).

The flash memory device may change the threshold voltages of the memory cells through the program operation. However, the threshold voltages of the memory cells may vary depending on temperatures at a point in time when the memory cells are programmed and at a point in time when the data are read from the memory cells.

SUMMARY

Embodiments of the present disclosure provide a nonvolatile memory device in which a read voltage varies depending on a temperature at a point in time when a program operation is performed and a temperature at a point in time when a read operation is performed, and an operation method thereof.

According to an embodiment, there is provided a nonvolatile memory device which may include a memory cell array including a plurality of memory cells connected to a plurality of word lines, an address decoder that controls a selected word line among the plurality of word lines based on an address received from an external device including a first temperature sensor, a second temperature sensor that measures a read temperature of first memory cells connected to the selected word line from among the plurality of memory cells, and a temperature compensation circuit that calculates a read level offset based on the read temperature and a program temperature of the first memory cells measured by the first temperature sensor and generates a compensation read voltage based on the read level offset, and the address decoder may be configured to provide the compensation read voltage to the selected word line.

According to an embodiment, there is provided an operation method of a nonvolatile memory device including a first temperature sensor. The method may include receiving, from an external device including a second temperature sensor, a read command for a first page and a program temperature of the first page measured by the second temperature sensor, measuring a read temperature of the first page by using the first temperature sensor in response to the read command, calculating a read level offset based on the program temperature and the read temperature, generating a compensation read voltage based on the read level offset, and performing a read operation on the first page based on the compensation read voltage.

According to an embodiment, there is provided an operation method of a storage device which includes a nonvolatile memory device including a first page, a volatile memory device, and a memory controller controlling the nonvolatile memory device and the volatile memory device. The method may include storing, by the memory controller, a first program temperature in the volatile memory device when a program operation is performed on the first page, transmitting, by the memory controller, a read command for the first page and the first program temperature to the nonvolatile memory device, measuring, by the memory controller or the nonvolatile memory device, a first read temperature, calculating, by the memory controller or the nonvolatile memory device, a first read level offset based on the first program temperature and the first read temperature, and performing, at the nonvolatile memory device, a read operation on the first page based on the first read level offset.

BRIEF DESCRIPTION OF DRAWINGS

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that one skilled in the art easily carries out the present disclosure. These embodiment are example embodiments. In the following description, specific details such as detailed components and structures are merely provided to assist the overall understanding of embodiments. Therefore, it should be apparent to those skilled in the art that various changes and modifications of the embodiments described herein may be made without departing from the scope and spirit of the invention. In addition, the descriptions of well-known functions and structures are omitted for clarity and brevity. In the following drawings or in the detailed description, components may be connected to any other components except for components illustrated in a drawing or described in the detailed description. The terms described in the specification are terms defined in consideration of the functions in the present disclosure and are not limited to a specific function. The definitions of the terms should be determined based on the contents throughout the specification. As used herein, an expression "at least one of" preceding a list of elements modifies the entire list of the elements and does not modify the individual elements of the list. For example, an expression, "at least one of a, b, and c" should be understood as including only a, only b, only c, both a and b, both a and c, both b and c, or all of a, b, and c.

Components that are described in the detailed description with reference to the terms "circuit", "block", etc. will be implemented with software, hardware, or a combination thereof. For example, the software may be a machine code, firmware, an embedded code, and application software. For example, the hardware may include an electrical circuit, an electronic circuit, a processor, a computer, integrated circuit cores, a pressure sensor, a micro electro mechanical system (MEMS), a passive element, or a combination thereof.

Figure 1:
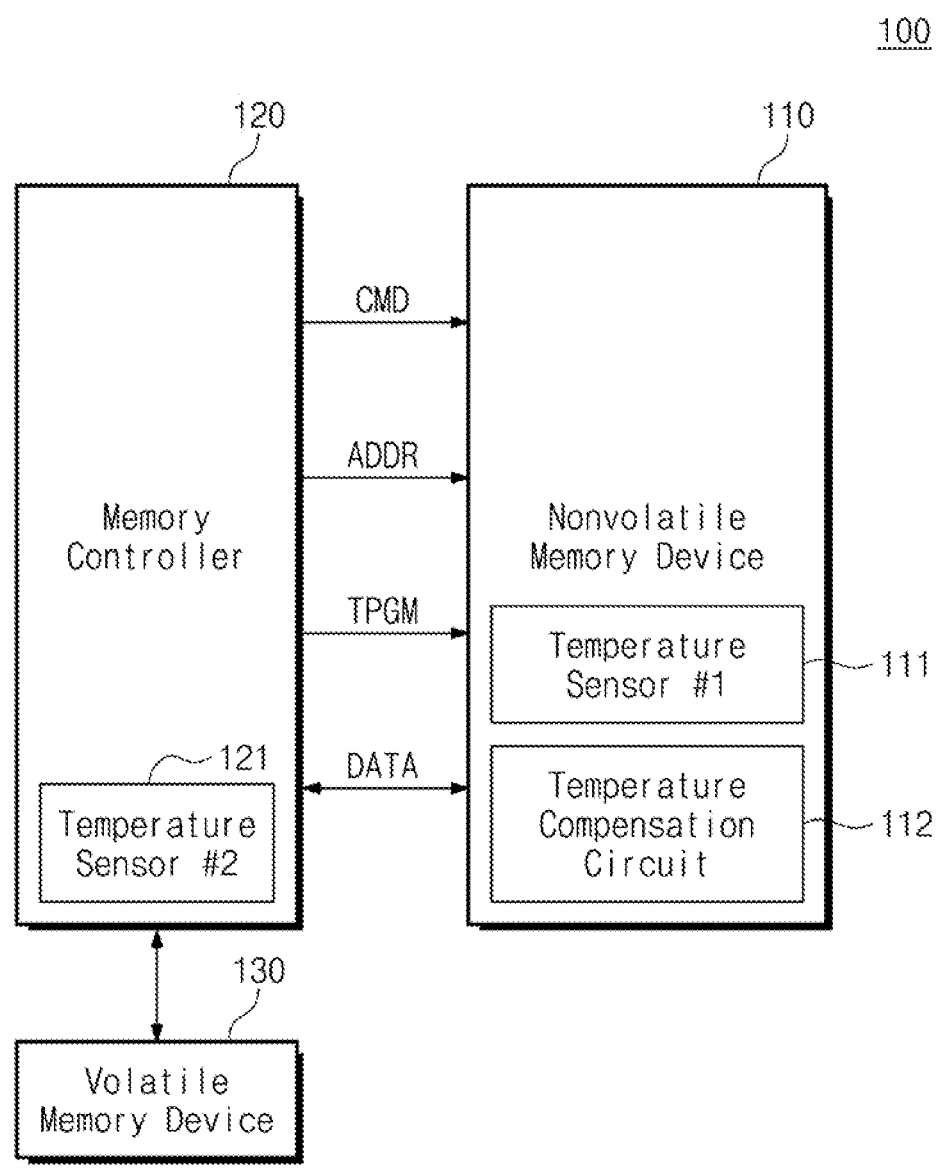
FIG. 1 is a block diagram illustrating a storage device, according to an embodiment.

FIG. 1 is a block diagram illustrating a storage device, according to an embodiment. Referring to FIG. 1, a storage device 100 may include a nonvolatile memory device 110, a memory controller 120, and a volatile memory device 130.

The memory controller 120 may store data DATA in the nonvolatile memory device 110 or may read the data DATA stored in the nonvolatile memory device 110. For example, the memory controller 120 may transmit a command CMD and an address ADDR to the nonvolatile memory device 110 for the purpose of storing the data DATA" in the nonvolatile memory device 110 or reading the data DATA stored in the nonvolatile memory device 110.

The nonvolatile memory device 110 may receive the command CMD and the address ADDR from the memory controller 120. The nonvolatile memory device 110 may operate in response to the received signals. For example, when the command CMD received from the memory controller 120 is a read command, the nonvolatile memory device 110 may return the data DATA to the memory controller 120. When the command CMD received from the memory controller 120 is a program command, the nonvolatile memory device 110 may store the data DATA received from the memory controller 120.

Below; an embodiment in which the nonvolatile memory device 110 is a flash memory device and the storage device 100 is a solid state drive (SSD) will be described representatively. However, the present disclosure is not limited thereto.

In an embodiment, the memory controller 120 may provide the command CMD, the address ADDR, and the data "DATA" to data input/output (DQ) pins (i.e., DQ pins).

The nonvolatile memory device 110 may include a plurality of memory cells. The read or program operation of the plurality of memory cells may be made through a plurality of word lines. In detail, the read or program operation of the plurality of memory cells may be performed in units of pages. Accordingly, data of memory cells of different pages may be programmed at different points in time and may be read at different points in time.

The nonvolatile memory device 110 may include a first temperature sensor (temperature sensor #1) 111. The first temperature sensor 111 may measure a temperature of the nonvolatile memory device 110. In detail, the first temperature sensor 111 may measure a read temperature TRD (marked as such in FIGS. 3, 6A, 6B and 7) of the nonvolatile memory device 110. The read temperature TRD may refer to a temperature of the nonvolatile memory device 110 when the read operation is performed on the nonvolatile memory device 110.

The memory controller 120 may include a second temperature sensor (temperature sensor #2) 121. The second temperature sensor 121 may also measure a temperature of the nonvolatile memory device 110. In detail, the second temperature sensor 121 may measure a program temperature TPGM (marked as such in FIGS. 3, 6A, 6B and 7) of the nonvolatile memory device 110. The program temperature TPGM may refer to a temperature of the nonvolatile memory device 110 when the program operation is performed on the nonvolatile memory device 110.

In an embodiment, the read temperature may be measured accurately by the first temperature sensor 111 compared to the case where the read temperature is measured by the second temperature sensor 121.

The memory controller 120 may store the measured program temperature TPGM in the volatile memory device 130. The volatile memory device 130 may store a program temperature TPGM for each page. For example, the volatile memory device 130 may store the program temperature TPGM of a first page and the program temperature TPGM of a second page independently of each other.

In an embodiment, the volatile memory device 130 may be a dynamic random access memory (DRAM) device. However, the present disclosure is not limited thereto. For example, the volatile memory device 130 may be a static random access memory (SRAM) device or a synchronous DRAM device. That is, the present disclosure is not limited to a type of the volatile memory device 130.

The nonvolatile memory device 110 may include a temperature compensation circuit 112. The temperature compensation circuit 112 may generate a 'compensation read voltage' based on the program temperature TPGM and the read temperature TRD.

For brief description, below, an embodiment in which the memory controller 120 transmits a read command for the first page to the nonvolatile memory device 110 will be described representatively. Accordingly, unless otherwise described clearly on the context, the program temperature TPGM may refer to a program temperature of the first page, and the read temperature TRD may refer to a read temperature of the first page.

When the read operation of the nonvolatile memory device 110 is performed, the memory controller 120 may provide the nonvolatile memory device 110 with the program temperature TPGM corresponding to the read operation. For example, when the read operation of the first page is performed in the nonvolatile memory device 110, the memory controller 120 may read the program temperature TPGM of the first page from the volatile memory device 130. Afterwards, the memory controller 120 may provide the program temperature TPGM of the first page to the nonvolatile memory device 110. When the command CMD and the address ADDR received from the memory controller 120 indicate the read operation of the first page, the first temperature sensor 111 may measure the read temperature TRD associated with the first page. In this case, the temperature compensation circuit 112 may generate the compensation read voltage based on the read temperature TRD of the first page (i.e., the temperature measured by the first temperature sensor 111) and the program temperature TPGM of the first page (i.e., the temperature measured by the second temperature sensor 121). In an embodiment, the compensation read voltage may correspond to a sum of a selected read voltage and a read level offset.

In an embodiment, the selected read voltage may refer to one of a plurality of read voltages, which are used to determine threshold voltages of memory cells in the nonvolatile memory device 110, when the program and read operations are performed at a predetermined temperature. The read voltage will be described in detail with reference to FIGS. 3, 4, 5A and 5B.

In an embodiment, the read level offset may refer to a voltage level by which the selected read voltage is corrected to perform the read operation accurately, when at least one of the program operation and the read operation is not performed at the predetermined temperature.

In an embodiment, the read level offset may vary depending on the selected read voltage. How the read level offset varies depending on the selected read voltage will be described in detail with reference to FIGS. 6A and 6B.

In an embodiment, the read level offset may vary depending on the program temperature TPGM and the read temperature TRD. For example, the temperature compensation circuit 112 may calculate the read level offset corresponding to the measured read temperature TRD, based on the program temperature TPGM and the selected read voltage. The relationship between the read voltage, the program temperature TPGM, the read temperature TRD, and the read level offset will be described in detail with reference to the following drawings.

In an embodiment, the temperature compensation circuit 112 may operate based on a relation equation of the read temperature TRD and the read level offset, which is determined based on the program temperature TPGM and the selected read voltage. For example, the temperature compensation circuit 112 may store a plurality of relation equations for the read temperature TRD and the read level offset, each of which is modeled based on for each of pairs of the read voltage and the program temperature TPGM. The temperature compensation circuit 112 may select one of the plurality of relation equations based on the selected read voltage and the received program temperature TPGM. The temperature compensation circuit 112 may calculate the read level offset based on the read temperature TRD, by using the selected relation equation.

That is, according to an embodiment, the read level offset may be calculated within the nonvolatile memory device 110, instead of determining the read level offset through a temperature bump table (TBT) stored in an internal SRAM of the memory controller 120. According to an embodiment, the size of data that are stored in the internal SRAM of the memory controller 120 may decrease.

Figure 2:
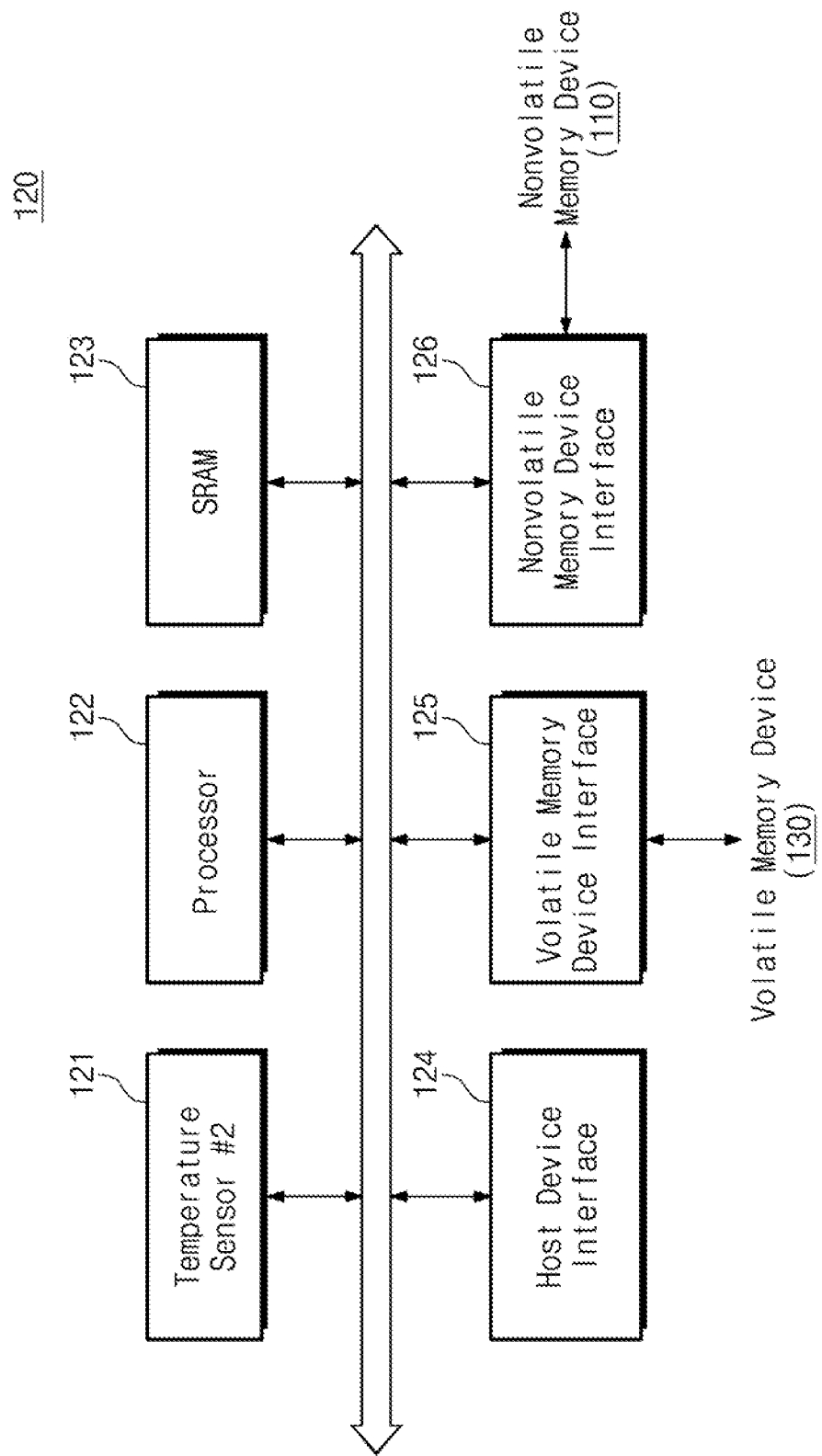
FIG. 2 is a block diagram illustrating a memory controller of FIG. 1 in detail, according to an embodiment.

FIG. 2 is a block diagram illustrating a memory controller of FIG. 1 in detail, according to an embodiment. Referring to FIGS. 1 and 2, the memory controller 120 may include the second temperature sensor 121, a processor 122, a static random access memory (SRAM) 123, a host device interface 124, a volatile memory device interface 125, and a nonvolatile memory device interface 126. The second temperature sensor 121, the processor 122, the SRAM 123, the host device interface 124, the volatile memory device interface 125, and the nonvolatile memory device interface 126 may be interconnected through a bus.

The processor 122 may control an overall operation of the memory controller 120. For example, the processor 122 may execute various applications (e.g., a flash translation layer (FTL)) on the memory controller 120.

The SRAM 123 may be used as a buffer memory, a working memory, or a cache memory of the memory controller 120.

In an embodiment, a capacity of the SRAM 123 may be restrictive. However, according to an embodiment, a capacity of a table (i.e., the temperature bump table TBT) for a read temperature, a program temperature, and a read level offset, which is stored in the SRAM 123 for the purpose of determining the read level offset, may decrease.

The memory controller 120 may communicate with a host device (not illustrated) through the host device interface 124. For example, the host device interface 124 may include at least one of various host device interfaces such as a PCI-express (Peripheral Component Interconnect express) interface, an NVMe (nonvolatile memory express) interface, a SATA (Serial ATA) interface, an SAS (Serial Attached SCSI) interface, and a UFS (Universal Flash Storage) interface.

The memory controller 120 may communicate and the volatile memory device 130 through the volatile memory device interface 125. For example, through the volatile memory device interface 125, the memory controller 120 may store the program temperature TPGM measured by the second temperature sensor 121 in the volatile memory device 130 or may read the program temperature TPGM stored in the volatile memory device 130.

The memory controller 120 may communicate with the nonvolatile memory device 110 through the nonvolatile memory device interface 126. For example, the nonvolatile memory device interface 126 may be a NAND interface.

Figure 3:
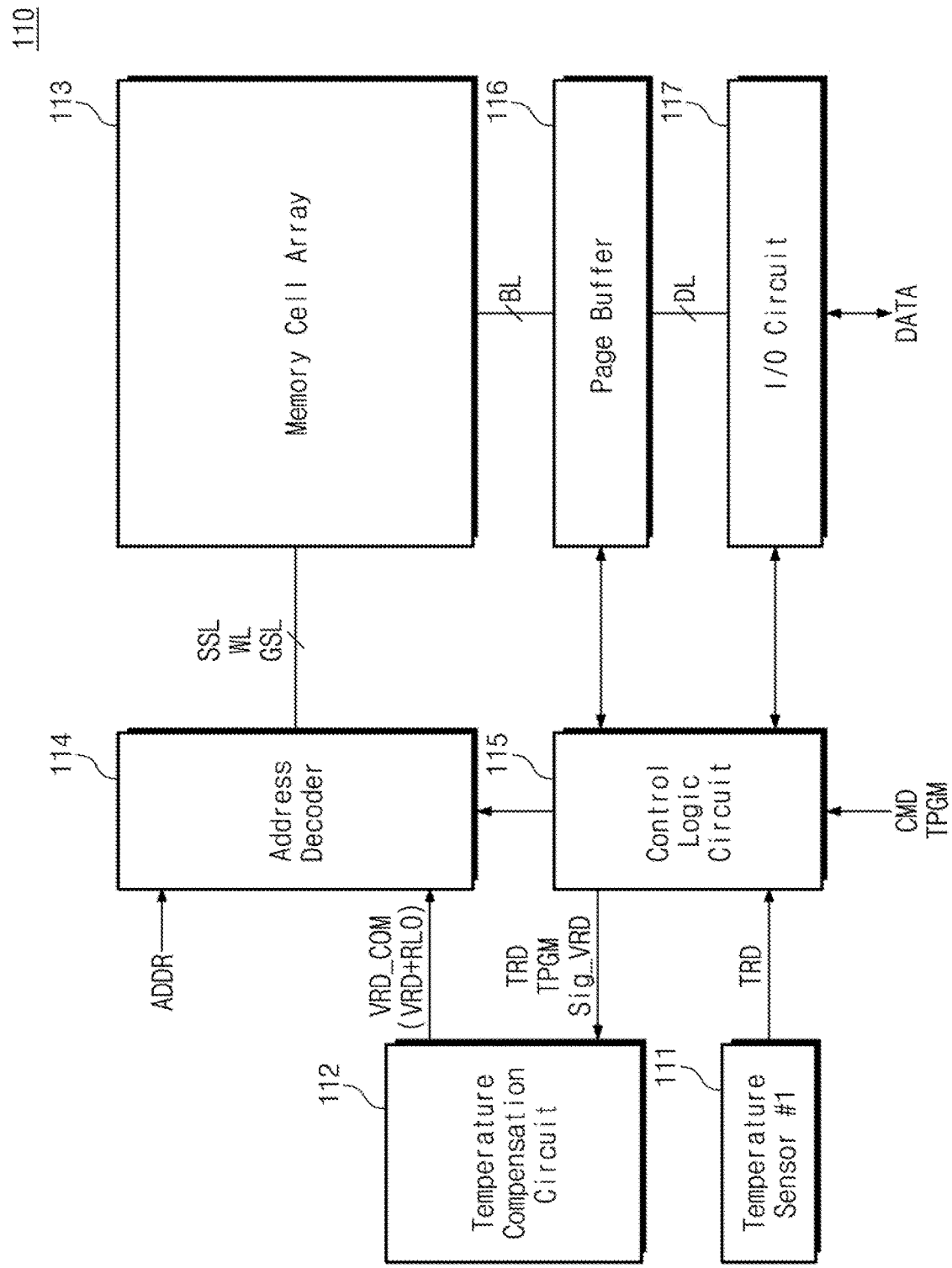
FIG. 3 is a block diagram illustrating a nonvolatile memory device of FIG. 1, according to an embodiment.

FIG. 3 is a block diagram illustrating a nonvolatile memory device of FIG. 1, according to an embodiment. Referring to FIGS. 1 to 3, the nonvolatile memory device 110 may include the first temperature sensor 111, the temperature compensation circuit 112, a memory cell array 113, an address decoder 114, a control logic circuit 115, a page buffer 116, and an input/output (I/O) circuit 117. For brief description, various signals such as the command CMD, the address ADDR, the data DATA, and the program temperature TPGM are illustrated in FIG. 2 as being directly provided to various function blocks, but the present disclosure is not limited thereto.

The memory cell array 113 may include a plurality of memory blocks. A configuration of each of the plurality of memory blocks will be described in detail with reference to FIG. 4.

The address decoder 114 may be connected to the memory cell array 113 through string selection lines SSL, word lines WL, and ground selection lines GSL. The address decoder 114 may receive the address ADDR from the memory controller 120. The address decoder 114 may decode the address ADDR, and may control voltages of the string selection lines SSL, the word lines WL, and the ground selection lines GSL based on the decoded result.

The page buffer 116 may be connected to the memory cell array 113 through bit lines BL. The page buffer 116 may be configured to temporarily store data to be stored in the memory cell array 113 or data read from the memory cell array 113.

The input/output circuit 117 may provide the data DATA received from the memory controller 120 to the page buffer 116 through data lines DL, or may provide the data DATA received through the data lines DL to the memory controller 120.

The control logic circuit 115 may receive the command CMD from the memory controller 120. The control logic circuit 115 may control an overall operation of the nonvolatile memory device 110 based on the received command CMD.

The control logic circuit 115 may receive the read command from the memory controller 120. In this case, the control logic circuit 115 may receive the program temperature TPGM corresponding to the received read command from the memory controller 120. For example, when the control logic circuit 115 receives the read command for the first page, the control logic circuit 115 may receive the program temperature TPGM of the first page from the memory controller 120. Below; an embodiment in which the received command CMD is the read command for the first page will be described in detail.

In an embodiment, the program temperature TPGM may be included in a command sequence of the command CMD provided from the memory controller 120. An embodiment in which the program temperature TPGM is included in the command sequence of the read command will be described in detail with reference to FIG. 13.

The control logic circuit 115 may receive the read temperature TRD from the first temperature sensor 111 in response to the read command received from the memory controller 120. For example, when the control logic circuit 115 receives the read command for the first page, the control logic circuit 115 may receive the read temperature TRD of the first page from the first temperature sensor 111.

The control logic circuit 115 may provide the temperature compensation circuit 112 with the read temperature TRD and the program temperature TPGM associated with the received read command. For example, when the control logic circuit 115 receives the read command for the first page, the control logic circuit 115 may provide the program temperature TPGM of the first page and the read temperature TRD of the first page to the temperature compensation circuit 112.

The control logic circuit 115 may provide a selected read voltage signal Sig_VRD to the temperature compensation circuit 112. In this case, the selected read voltage signal Sig_VRD may refer to a signal indicating a selected read voltage VRD which is one of a plurality of read voltages defined discretely. For example, the selected read voltage signal Sig_VRD may include an identifier of the selected read voltage VRD. The plurality of read voltages will be described in detail with reference to FIG. 5A.

The temperature compensation circuit 112 may generate a compensation read voltage VRD_COM corresponding to the selected read voltage VRD in response to the selected read voltage signal Sig_VRD. In this case, the compensation read voltage VRD_COM may be a sum of the selected read voltage VRD and a read level offset RLO.

The temperature compensation circuit 112 may determine the read level offset RLO based on the selected read voltage VRD, the program temperature TPGM, and the read temperature TRD. For example, the temperature compensation circuit 112 may store a plurality of relation equations for a read temperature and a read level offset, which are modeled with respect to a plurality of pairs of different read voltages and a program temperature. The temperature compensation circuit 112 may select a relation equation corresponding to the selected read voltage VRD and the received program temperature TPGM from among the plurality of relation equations thus stored. The temperature compensation circuit 112 may calculate the read level offset RLO corresponding to the received read temperature TRD, based on the selected relation equation.

The temperature compensation circuit 112 may generate the compensation read voltage VRD_COM based on the calculated read level offset RLO and the selected read voltage VRD. The temperature compensation circuit 112 may provide the generated compensation read voltage VRD_COM to a 'selected word line' through the address decoder 114. In this case, the selected word line may refer to a word line corresponding to the address ADDR input to the address decoder 114. For example, the selected word line may refer to a first word line associated with the first page.

Figure 4:
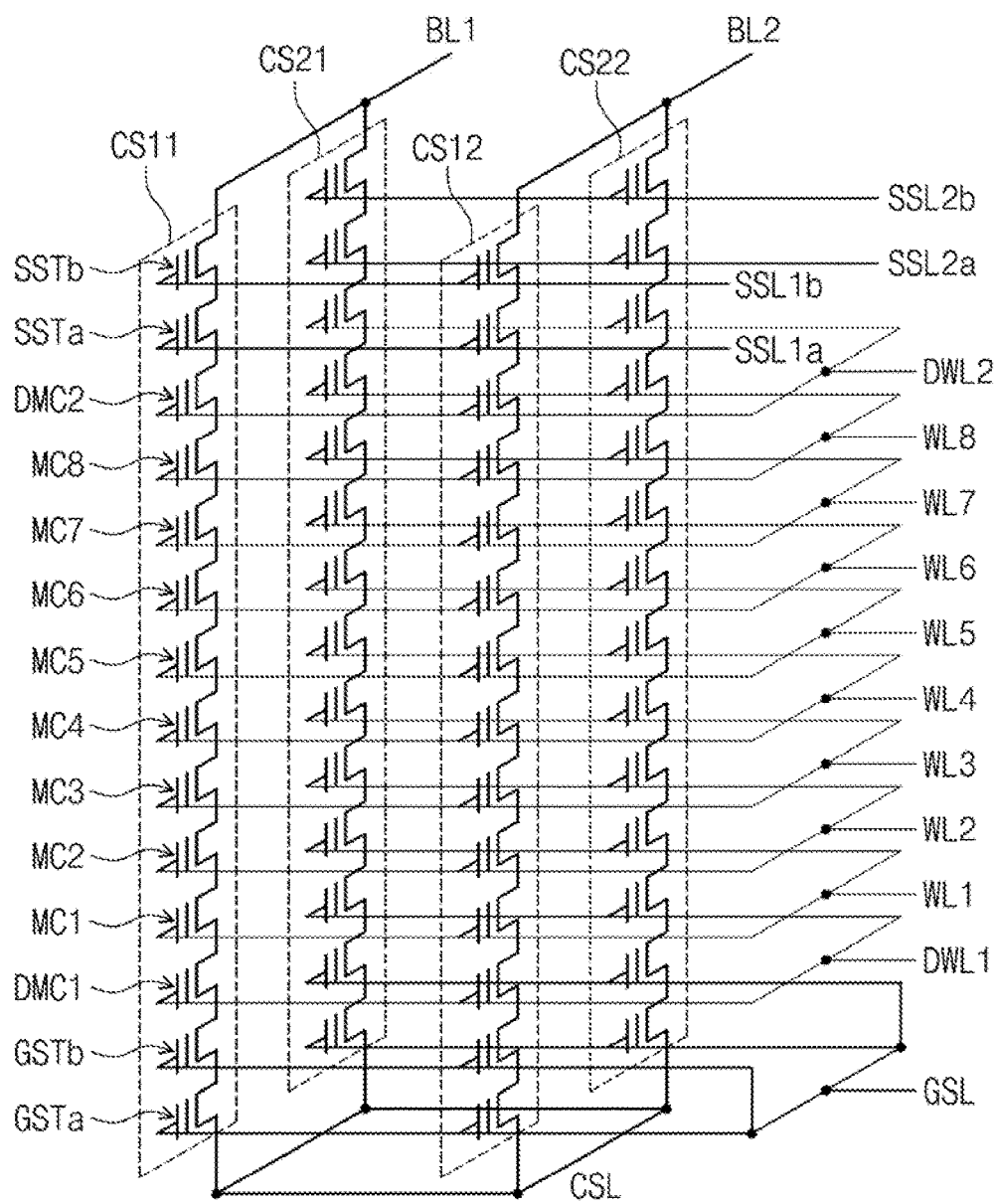
FIG. 4 is a circuit diagram illustrating one memory block of a plurality of memory blocks included in a memory cell array of FIG. 3, according to an embodiment.

FIG. 4 is a circuit diagram illustrating one memory block BLK of a plurality of memory blocks included in a memory cell array of FIG. 3, according to an embodiment. One memory block BLK will be described with reference to FIG. 4, but the present disclosure is not limited thereto. A plurality of memory blocks included in the memory cell array 113 may be the same as or similar in structure to the memory block BLK of FIG. 4.

Referring to FIGS. 3 and 4, the memory block BLK may include a plurality of cell strings CS11, CS12, CS21, and CS22. The plurality of cell strings CS11, CS12, CS21, and CS22 may be arranged in a row direction and a column direction.

Cell strings located at the same column from among the plurality of cell strings CS11, CS12, CS21, and CS22 may be connected to the same bit line. Cell strings located at the same row from among the plurality of cell strings CS11, CS12, CS21, and CS22 may be connected to the different bit lines. For example, the cell strings CS11 and CS21 may be connected to a first bit line BL1, and the cell strings CS12 and CS22 may be connected to a second bit line BL2.

Each of the plurality of cell strings CS11, CS12, CS21, and CS22 may include a plurality of cell transistors. Each of the plurality of cell transistors may be implemented with a charge trap flash (CTF) memory cell. The plurality of cell transistors may be stacked in a height direction that is a direction perpendicular to a plane (e.g., a semiconductor substrate (not illustrated)) defined by the row direction and the column direction.

The plurality of cell transistors may be connected in series between the corresponding bit line (e.g., the first bit line BL1 or the second bit line BL2) and a common source line CSL. For example, the plurality of cell transistors may include string selection transistors SSTa and SSTb, dummy memory cells DMC1 and DMC2, memory cells MC1 to MC8, and ground selection transistors GSTa and GSTb. The serially-connected string selection transistors SSTa and SSTb may be provided between serially-connected memory cells MC1 to MC8 and a corresponding bit line (e.g., BL1 and BL2). The serially-connected ground selection transistors GSTa and GSTb may be provided between the serially-connected memory cells MC1 to MC8 and the common source line CSL.

In an exemplary embodiment, the second dummy memory cell DMC2 may be provided between the serially-connected string selection transistors SSTa and SSTb and the serially-connected memory cells MC1 to MC8, and the first dummy memory cell DMC1 may be provided between the serially-connected memory cells MC1 to MC8 and the serially-connected ground selection transistors GSTa and GSTb.

In each of the plurality of cell strings CS11, CS12, CS21, and CS22, memory cells located at the same height from among the memory cells MC1 to MC8 may share the same word line. For example, the first memory cells MC1 of the plurality of cell strings CS11, CS12, CS21, and CS22 may be located at the same height from the substrate (not illustrated) and may share a first word line WL1. The second memory cells MC2 of the plurality of cell strings CS11, CS12, CS21, and CS22 may be located at the same height from the substrate (not illustrated) and may share a second word line WL2. Likewise, the third to eighth memory cells MC3 to MC8 of the plurality of cell strings CS11, CS12, CS21, and CS22 may be positioned at the same heights from the substrate (not illustrated) and may share third to eighth word lines WL3 to WL8, respectively.

In an embodiment, one page may be composed of memory cells of cell strings located at the same row from among memory cells located at the same height. For example, the first page may be composed of memory cells included in the cell strings CS11 and CS12 from among the first memory cells MC1. In this case, the memory cells of the first page may be connected to the same word line and may respectively correspond to different bit lines. The memory cells of the first page may be simultaneously programmed and may be simultaneously read.

As in the above description, the second page may be composed of memory cells included in the cell strings CS21 and CS22 from among the first memory cells MC1. A configuration and an operation of the memory cells of the second page may be similar to those of the memory cells of the first page, and thus, duplicate description will be omitted to avoid redundancy.

Dummy memory cells located at the same height from among the dummy memory cells DMC1 and DMC2 of the plurality of cell strings CS11, CS12, CS21, and CS22 may share the same dummy word line. For example, the first dummy memory cells DMC1 of the plurality of cell strings CS11, CS12, CS21, and CS22 may share a first dummy word line DWL1, and the second dummy memory cells DMC2 of the plurality of cell strings CS11, CS12, CS21, and CS22 may share a second dummy word line DWL2.

String selection transistors located at the same height and the same row from among the string selection transistors SSTa and SSTb of the plurality of cell strings CS11, CS12, CS21, and CS22 may share the same string selection line. For example, the string selection transistors SSTb of the cell strings CS11 and CS12 may share a string selection line SSL1b, and the string selection transistors SSTa of the cell strings CS11 and CS12 may share a string selection line SSL1a. The string selection transistors SSTb of the cell strings CS21 and CS22 may be connected to a string selection line SSL2b, and the string selection transistors SSTa of the cell strings CS21 and CS22 may be connected to a string selection line SSL2a.

Although not illustrated in FIG. 3, string selection transistors located at the same row from among the string selection transistors SSTa and SSTb of the plurality of cell strings CS11, CS12, CS21, and CS22 may share the same string selection line. For example, the string selection transistors SSTb and SSTa of the cell strings CS11 and CS12 may share a first string selection line, and the string selection transistors SSTb and SSTa of the cell strings CS21 and CS22 may share a second string selection line different from the first string selection line.

Ground selection transistors placed at the same height and the same row from among the ground selection transistors GSTa and GSTb of the plurality of cell strings CS11, CS12, CS21, and CS22 may be connected to the same ground selection line.

The memory block BLK illustrated in FIG. 4 is provided as an example. For example, the number of cell strings may increase or decrease, and the number of rows of cell strings and the number of columns of cell strings may increase or decrease depending on the change in the number of cell strings. Also, the number of cell transistors (e.g., GST, MC, DMC, and SST) in the memory block BLK may increase or decrease, and the height of the memory block BLK may increase or decrease depending on the number of cell transistors (e.g., GST, MC, DMC, and SST). In addition, the number of lines (i.e., GSL, WL, DWL, and SSL) connected to the cell transistors may increase or decrease depending on the number of cell transistors.

Figure 5A:
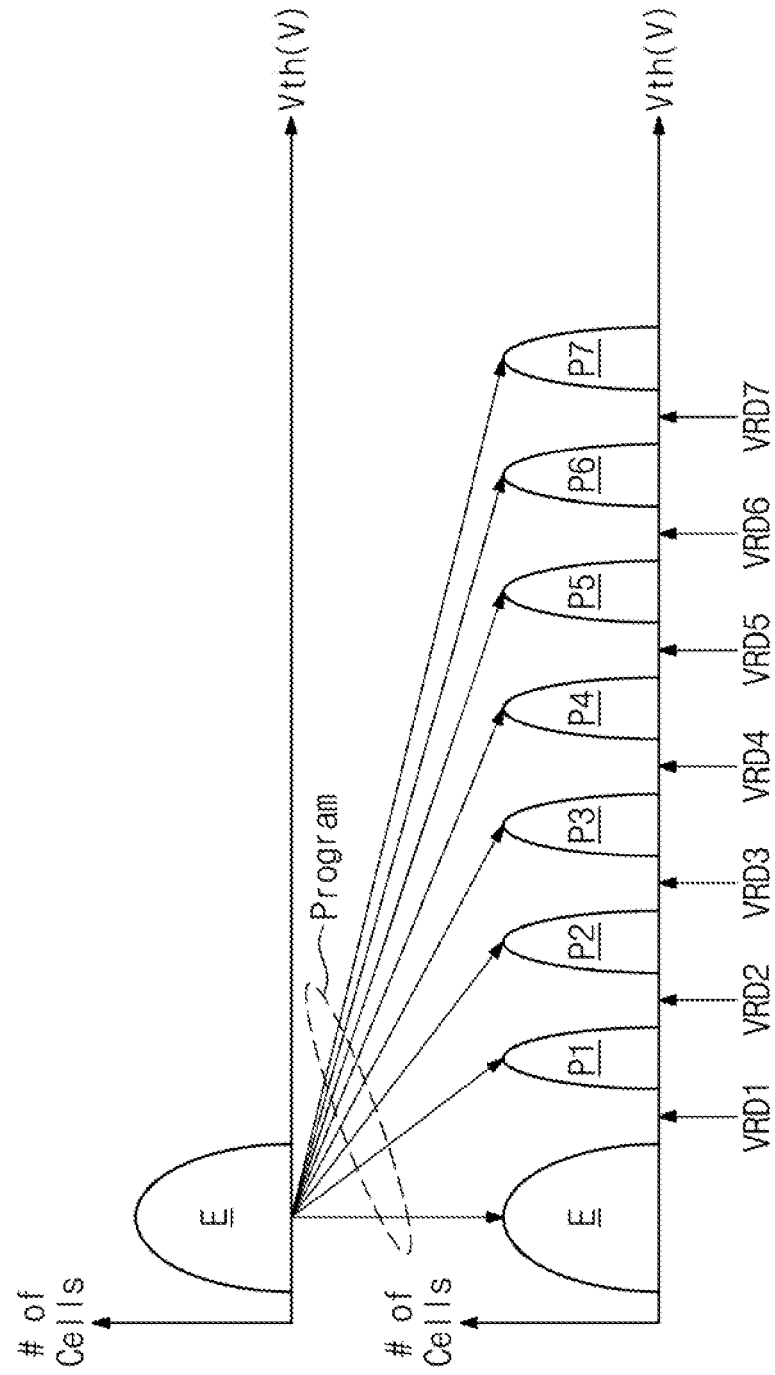
FIGS. 5A and 5B are diagrams illustrating threshold voltage distributions of a plurality of memory cells included in a memory block of FIG. 4, according to an embodiment.
Figure 5B:
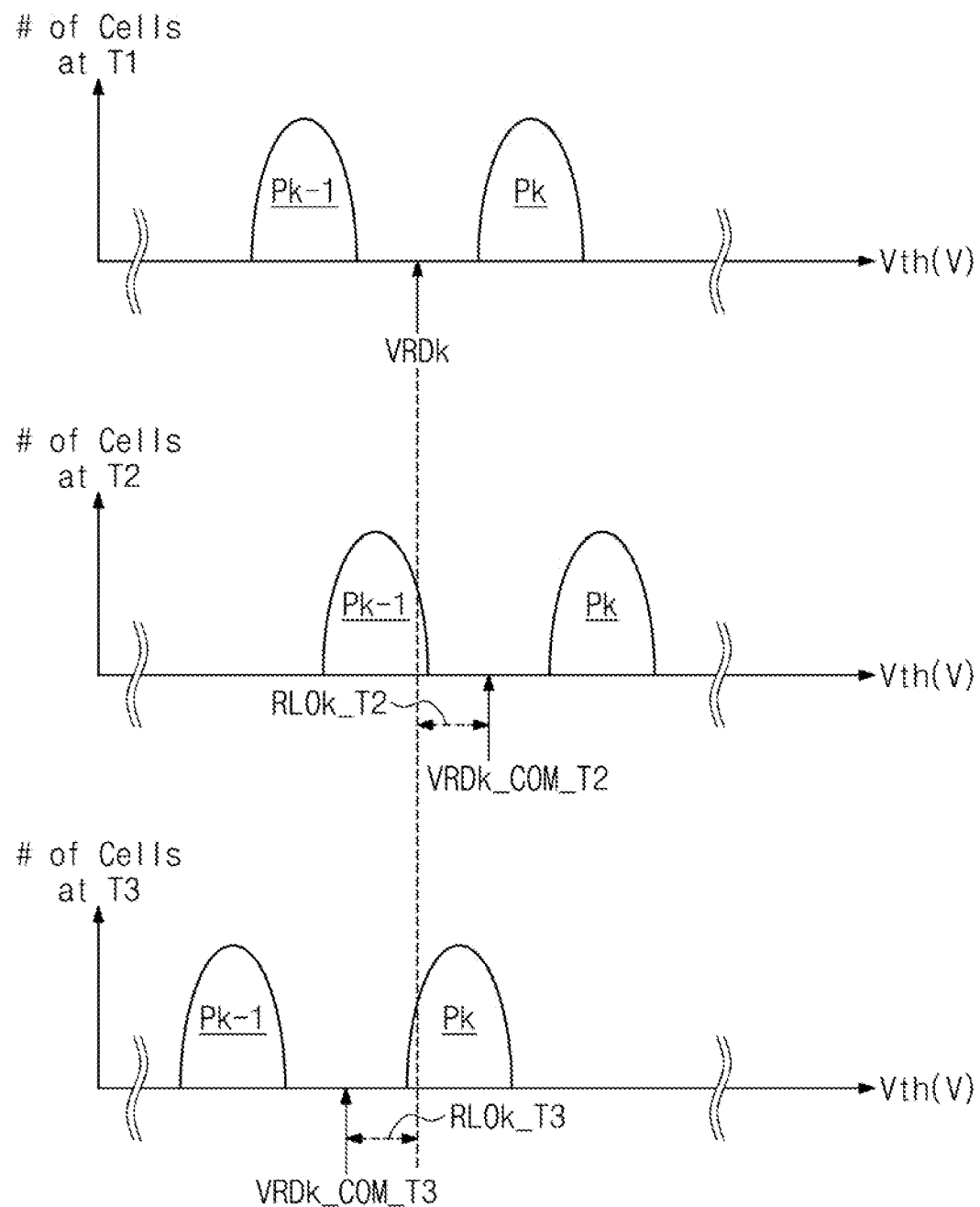

FIGS. 5A and 5B illustrate threshold voltage distributions of a plurality of memory cells included in a memory block of FIG. 4, according to embodiments. In FIGS. 5A and 5B, a horizontal axis represents a threshold voltage Vth of a memory cell, and a vertical axis represents the number of memory cells. For convenience of description, below, it is assumed that each of a plurality of memory cells is a triple level cell configured to store 3-bit data. However, the present disclosure is not limited thereto. For example, each of the plurality of memory cells may be variously implemented with a single level cell (SLC), a multi-level cell (MLC), a quad-level cell (QLC), a penta-level cell (PLC), etc.

Referring to FIGS. 3, 4, and 5A, the nonvolatile memory device 110 may store data in the memory cells by controlling threshold voltages of the memory cells. Each of the memory cells may be programmed to have one of an erase state E and first to seventh program states P1 to P7.

The nonvolatile memory device 110 may read the data stored in the memory cells by sensing the program states of the memory cells. For example, the nonvolatile memory device 110 may read the data stored in the memory cells by sensing the threshold voltages of the memory cells by using first to seventh read voltages VRD1 to VRD7.

In an embodiment, the threshold voltages of the programmed memory cells may vary depending on a temperature. The threshold voltages of the memory cells that vary depending on a temperature will be described in detail with reference to FIG. 5B.

For brief description, below; threshold voltage distributions of memory cells having the (k−1)-th program state Pk−1 and the k-th program state Pk among the first to seventh program states P1 to P7 will be described representatively. However, the present disclosure is not limited thereto.

Referring to FIGS. 3, 4, 5A, and 5B, at a first temperature T1, by using the k-th read voltage VRDk, the nonvolatile memory device 110 may determine whether each memory cell is in a program state corresponding to a threshold voltage higher than the k-th read voltage VRDk or in a program state corresponding to a threshold voltage lower than the k-th read voltage VRDk. In this case, the k-th read voltage VRDk may correspond to the selected read voltage VRD described with reference to FIG. 3.

However, a distribution of the memory cells at a second temperature T2 higher than the first temperature T1 may be different from a distribution of the memory cells at the first temperature T1. For example, the threshold voltages of the memory cells at the second temperature T2 may be higher than the threshold voltages of the memory cells at the first temperature T1. In this case, the nonvolatile memory device 110 may fail to determine whether each memory cell is in the program state corresponding to the threshold voltage higher than the k-th read voltage VRDk or in the program state corresponding to the threshold voltage lower than the k-th read voltage VRDk, by using the k-th read voltage VRDk. In detail, when the nonvolatile memory device 110 uses the k-th read voltage VRDk, it may be determined that some of the memory cells having the (k–1)-th program state Pk–1 have threshold voltages higher than the k-th read voltage VRDk and the others thereof have threshold voltages lower than the k-th read voltage VRDk. In this case, an error may occur in the data read from the memory cells.

In an embodiment, at the second temperature T2, when the nonvolatile memory device 110 uses a k-th compensation read voltage VRDk_COM_T2 higher than the k-th read voltage VRDk, there may be determined whether each memory cell is in a program state corresponding to a threshold voltage higher than the k-th compensation read voltage VRDK_COM_T2 or in a program state corresponding to a threshold voltage lower than the k-th compensation read voltage VRDK_COM_T2. That is, the nonvolatile memory device 110 may perform the read operation by using the k-th compensation read voltage VRDK_COM_T2, which corresponds to a sum of the k-th read voltage VRDk and a k-th read level offset RLOk_T2, instead of the k-th read voltage VRDk. In this case, the k-th read level offset RLOk may correspond to the read level offset RLO described with reference to FIG. 3, and the k-th compensation read voltage VRDk_COM_T2 may correspond to the compensation read voltage VRD_COM described with reference to FIG. 3.

In contrast, the threshold voltages of the memory cells at a third temperature T3 lower than the first temperature T1 may be lower than the threshold voltages of the memory cells at the first temperature T1. In this case, the nonvolatile memory device 110 may perform the read operation by using the k-th compensation read voltage VRDK_COM_T3 lower than the k-th read voltage VRDk, instead of the k-th read voltage VRDK.

That is, according to an embodiment, a k-th read level offset RLOk may vary depending on the read temperature TRD. The k-th read level offset RLOk that is appropriate at the read temperature TRD may be tested in advance (e.g., before the read operation is performed) (in this case, the "appropriate k-th read level offset RLOk" may refer to the k-th read level offset RLOk that allows the k-th compensation read voltage VRDK_COM_T2 or VRDk_COM_T3 to correspond to the voltage level between the (k–1)-th program state Pk–1 and the k-th program state Pk). The temperature compensation circuit 112 may store relation equations, each of which is modeled based on the "appropriate k-th read level offset RLOk" for each tested read temperature TRD.

That is, the temperature compensation circuit 112 may generate the compensation read voltage VRD_COM by calculating an appropriate read level offset RLO for the read temperature TRD based on the stored relation equations. Accordingly, according to an embodiment, when as the read temperature of the nonvolatile memory device 110 at a point in time when the read operation is performed is high, the read operation may be performed by using a relatively high compensation read voltage VRD_COM. In contrast, when as the read temperature of the nonvolatile memory device 110 at a point in time when the read operation is performed is low, the read operation may be performed by using a relatively low compensation read voltage VRD_COM.

Figure 6A:
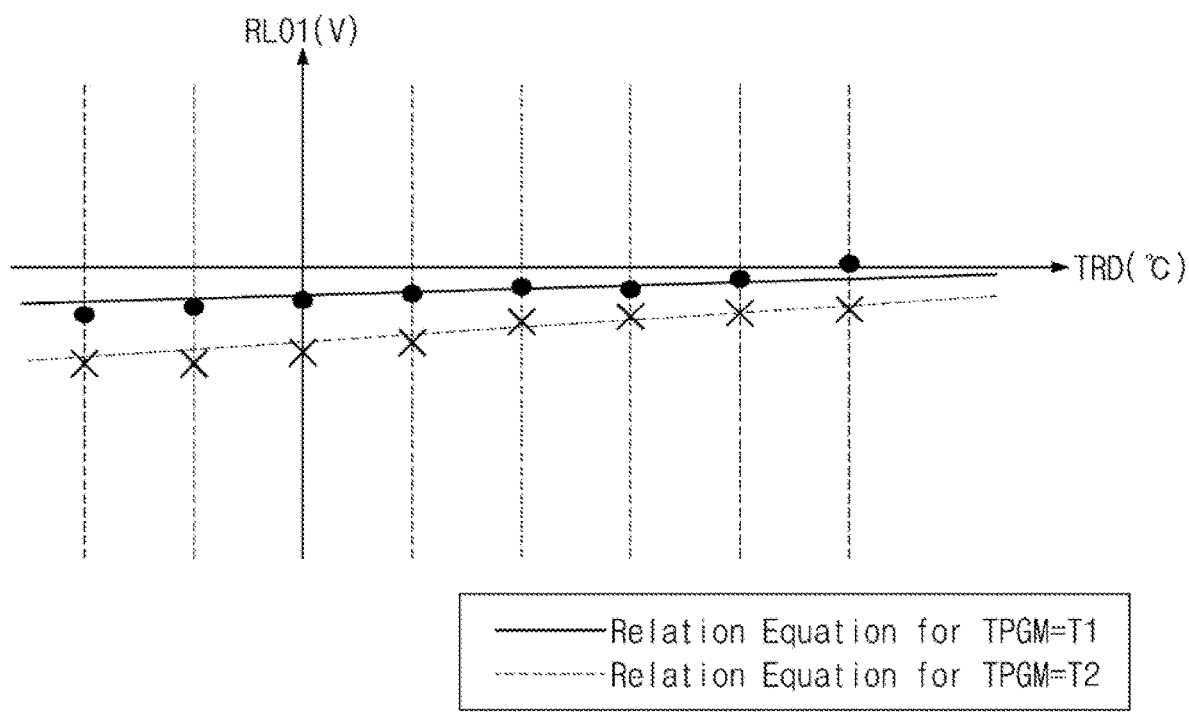
FIGS. 6A and 6B are diagrams illustrating a relationship between a selected read voltage, a program temperature, a read temperature, and a read level offset, according to an embodiment.
Figure 6B:
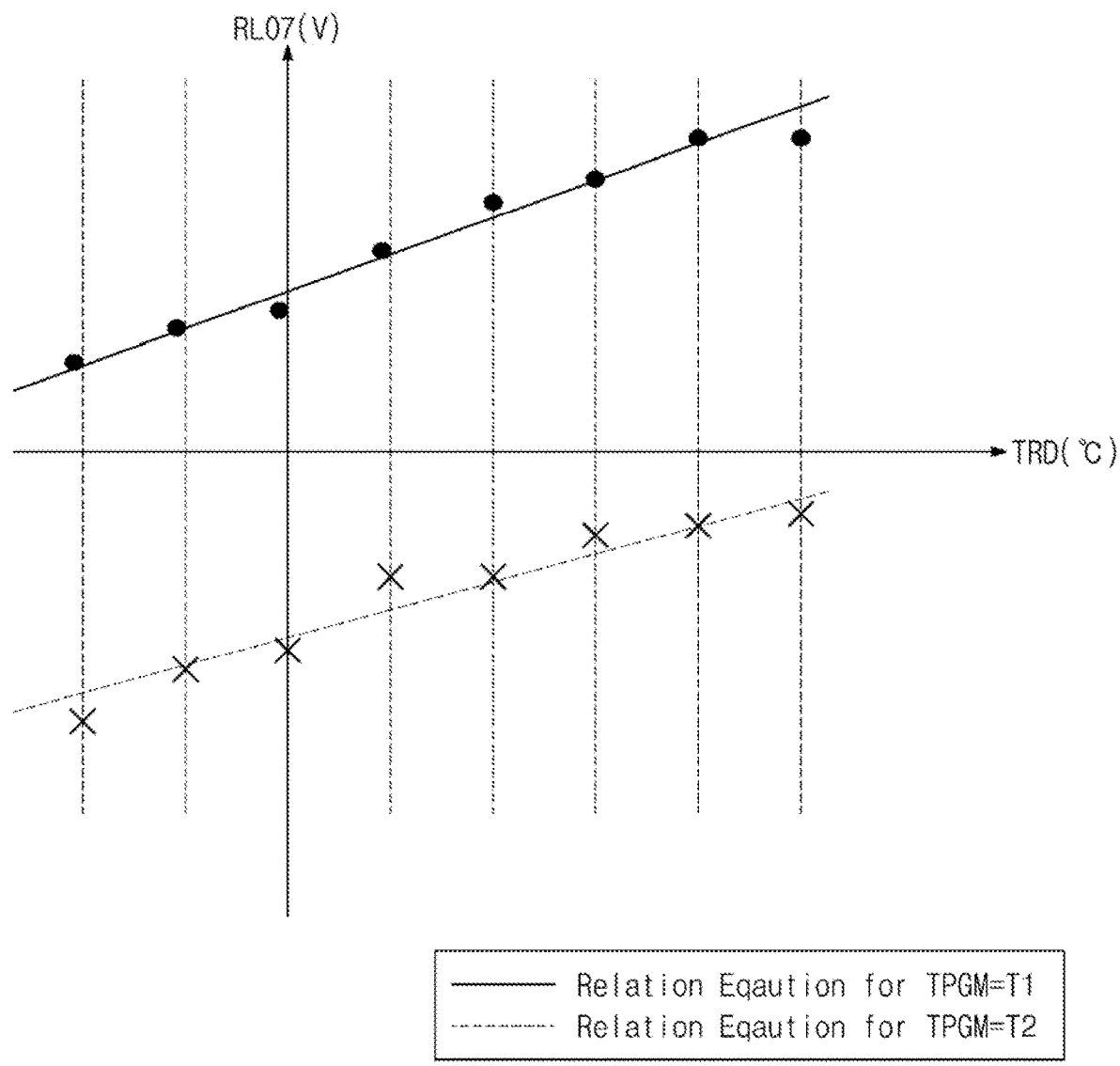

FIGS. 6A and 6B illustrate a relationship between a selected read voltage, a program temperature, a read temperature, and a read level offset, according to embodiments. In FIGS. 6A and 6B, a horizontal axis represents a temperature, and a vertical axis represents a voltage. For brief description, below, an embodiment in which the selected read voltage VRD is the first read voltage VRD1 of FIG. 5A will be described representatively with reference to FIG. 6A, and an embodiment in which the selected read voltage VRD is the seventh read voltage VRD7 of FIG. 5A will be described representatively with reference to FIG. 6B.

Referring to FIGS. 3, 4, 5A, 5B, and 6A, each black circle (shown in FIGS. 6A and 6B) indicates a read level offset for each read temperature TRD, which is tested in advance under a condition that the selected read voltage VRD is the first read voltage VRD1 and the program temperature TPGM is the first temperature T1 (below; for brief description, the appropriate read level offset corresponding to the case where the selected read voltage VRD is the first read voltage VRD1 may refer to the first read level offset RLO1). Further, "X" shown in FIGS. 6A and 6B indicates the first read level offset RLO1 that is tested in advance under a condition that the selected read voltage VRD is the first read voltage VRD1 and the program temperature TPGM is the second temperature T2 higher than the first temperature T1.

The first read level offset RLO1 may have an arbitrary mathematical relationship with respect to the read temperature TRD. For example, the first read level offset RLO1 may have linearity with respect to the read temperature TRD. For brief description, below; an embodiment in which the first read level offset RLO1 tested in advance has linearity with respect to the read temperature TRD will be described representatively. However, the present disclosure is not limited thereto. For example, the first read level offset RLO1 tested in advance may be nonlinear (e.g., a polynomial function, a logarithmic function relationship, or an exponential function relationship) with respect to the read temperature TRD.

In an embodiment, through the linear regression, a linear relation equation between the read temperature TRD and the first read level offset RLO1 may be modeled. In detail, when the program temperature TPGM is the first temperature T1 (refer to black circles in FIG. 6A), the relation equation of the read temperature TRD and the first read level offset RLO1 is illustrated as a solid line. As in the above description, when the program temperature TPGM is the second temperature T2 (refer to "X" in FIG. 6A), the relation equation of the read temperature TRD and the first read level offset RLO1 is illustrated as a dashed line.

Referring to FIGS. 3, 4, 5A, 5B, and 6B, each black circle indicates a read level offset for each read temperature TRD, which is tested in advance under a condition that the selected read voltage VRD is the seventh read voltage VRD7 and the program temperature TPGM is the first temperature T1 (below, for brief description, the appropriate read level offset corresponding to the case where the selected read voltage VRD is the seventh read voltage VRD7 may refer to the seventh read level offset RLO7). Further, "X" indicates the seventh read level offset RLO7 that is tested in advance under a condition that the selected read voltage VRD is the seventh read voltage VRD7 and the program temperature TPGM is the second temperature T2 higher than the first temperature T1.

As in the description given with reference to FIG. 6A, through the linear regression, a linear relation equation between the read temperature TRD and the seventh read level offset RLO7 may be modeled. In detail, when the program temperature TPGM is the first temperature T1, the relation equation of the read temperature TRD and the seventh read level offset RLO7 is illustrated as a solid line. As in the above description, when the program temperature TPGM is the second temperature T2, the relation equation of the read temperature TRD and the seventh read level offset RLO7 is illustrated as a dashed line.

In an embodiment, comparing FIGS. 6A and 6B, the read level offset RLO may vary depending on the corresponding selected read voltage VRD. For example, the first read level offset RLO1 corresponding to the first read voltage VRD1 may be different from the seventh read level offset RLO7 corresponding to the seventh read voltage VRD7. That is, according to an embodiment, the temperature compensation circuit 112 may store a relation equation of the read temperature TRD and the read level offset RLO, which differs for each of the first to seventh read voltages VRD1 to VRD7 and for each of different program temperatures TPGM. In this case, because the read level offset RLO for each read temperature TRD is calculated based on the stored relation equations, the read level offset RLO may be adjusted to be smaller than the resolution of the first temperature sensor 111. Accordingly, according to an embodiment, the read level offset RLO may be determined more accurately.

In an embodiment, the read level offset RLO may also be linear with reference to the program temperature TPGM. However, the present disclosure is not limited thereto.

Figure 7:
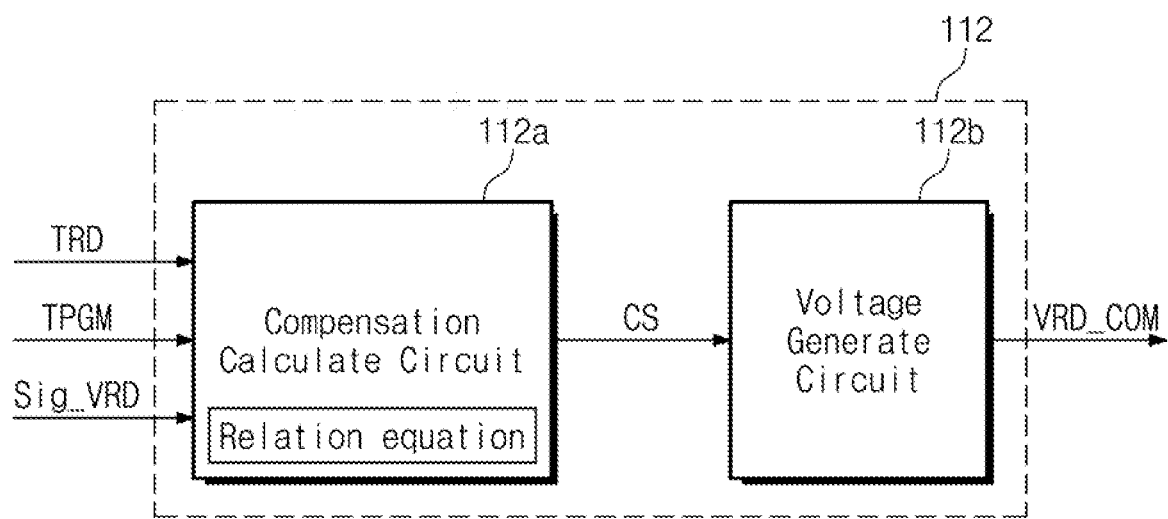
FIG. 7 is a block diagram illustrating a temperature compensation circuit of FIG. 3 in detail, according to an embodiment.

FIG. 7 is a block diagram illustrating a temperature compensation circuit of FIG. 3 in detail, according to an embodiment. Referring to FIGS. 3 to 7, the temperature compensation circuit 112 may include a compensation calculate circuit 112a and a voltage generate circuit 112b.

The compensation calculate circuit 112a may receive the read temperature TRD, the program temperature TPGM, and the selected read voltage signal Sig_VRD from the control logic circuit 115. The compensation calculate circuit 112a may select one of the plurality of relation equations based on the received program temperature TPGM and the received selected read voltage signal Sig_VRD. The compensation calculate circuit 112a may calculate the read level offset RLO based on the selected relation equation. For example, the compensation calculate circuit 112a may calculate the read level offset RLO by substituting the received read temperature TRD into the selected relation equation.

The compensation calculate circuit 112a may control the voltage generate circuit 112b based on the calculated read level offset. That is, the compensation calculate circuit 112a may provide a control signal CS to the voltage generate circuit 112b. The voltage generate circuit 112b may generate the compensation read voltage VRD_COM corresponding to the calculated read level offset RLO in response to the control signal CS. In this case, the compensation read voltage VRD_COM may correspond to a sum of the selected read voltage VRD corresponding to the selected read voltage signal Sig_VRD and the calculated read level offset RLO.

In an embodiment, the control signal CS may be implemented with a digital code. For example, the control signal CS may be a 1-byte digital code. However, the present disclosure is not limited thereto.

Figure 8:
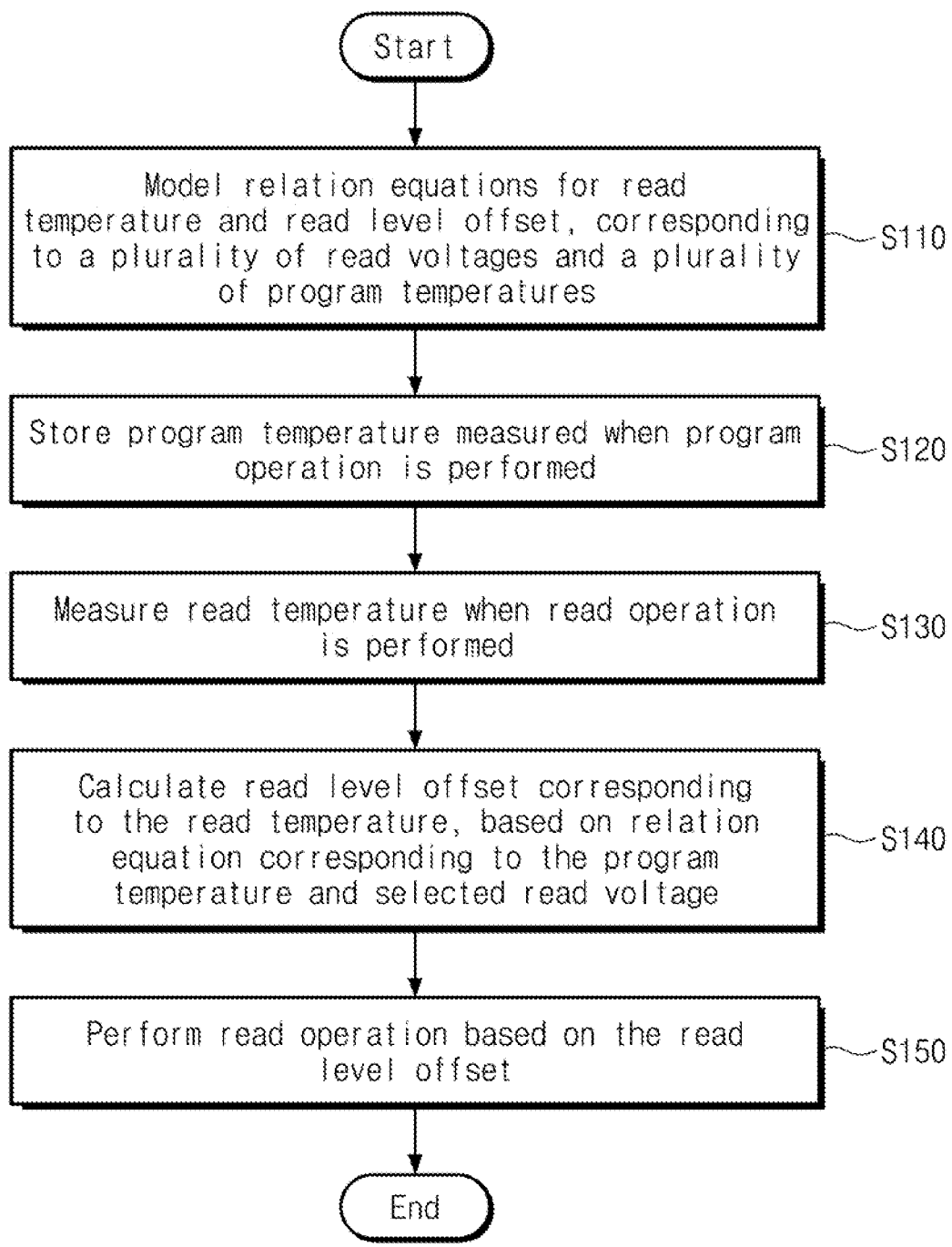
FIG. 8 is a flowchart illustrating an operation method of a storage device of FIG. 1, according to an embodiment.

FIG. 8 is a flowchart illustrating an operation method of a storage device of FIG. 1, according to an embodiment. Referring to FIGS. 1 to 8, in operation S110, the storage device 100 may model a plurality of relation equations for a read temperature and a read level offset, which respectively correspond to a plurality of read voltages and a plurality of program temperatures. For example, the storage device 100 may model a relation equation of the read temperature TRD and the read level offset RLO, based on the program temperature TPGM and the selected read voltage VRD. That is, each of the plurality of relation equations may correspond to an arbitrary combination of program temperatures and read voltages (or one of sets of program temperatures and read voltages). In this case, the temperature compensation circuit 112 may store the relation equations for the read temperature TRD and the read level offset RLO, each of which is modeled based on a pair of selected read voltage VRD and the program temperature TPGM.

In an embodiment, operation S110 may be performed in the process of manufacturing the storage device 100. However, the present disclosure is not limited thereto.

In an embodiment, operation S110 may be performed based on the machine learning.

In an embodiment, the plurality of relation equations thus modeled may be adjusted based on an error rate of the read operation for the nonvolatile memory device 110. For example, when the error rate of the read operation for the nonvolatile memory device 110 exceeds an arbitrary threshold value, coefficients of the plurality of relation equations modeled based on the machine learning may be adjusted.

In operation S120, the storage device 100 may store the program temperature TPGM measured when the program operation is performed. For example, when the program operation is performed on the first page, the memory controller 120 may measure the program temperature TPGM of the first page by using the second temperature sensor 121 included in the memory controller 120. The measured program temperature TPGM may be stored in the volatile memory device 130.

In operation S130, the storage device 100 may measure the read temperature TRD when the read operation is performed. For example, in response to the read command for the first page, the nonvolatile memory device 110 may measure the read temperature TRD of the first page by using the first temperature sensor 111 included in the nonvolatile memory device 110.

In operation S140, the storage device 100 may determine the read level offset RLO corresponding to the read temperature TRD, based on a relation equation corresponding to the program temperature TPGM and the selected read voltage VRD. For example, the temperature compensation circuit 112 may calculate the read level offset RLO by substituting the read temperature TRD measured in operation S130 into the relation equation corresponding to the program temperature TPGM and the selected read voltage VRD from among the plurality of relation equations modeled in operation S110. Operation S140 will be described in detail with reference to FIG. 11.

In operation S150, the storage device 100 may perform the read operation based on the calculated read level offset RLO. For example, the temperature compensation circuit 112 may generate the compensation read voltage VRD_COM based on the selected read voltage VRD and the calculated read level offset RLO. The temperature compensation circuit 112 may provide the generated compensation read voltage VRD_COM to the selected word line through the address decoder 114. Operation S150 will be described in detail with reference to FIG. 12.

Figure 9:
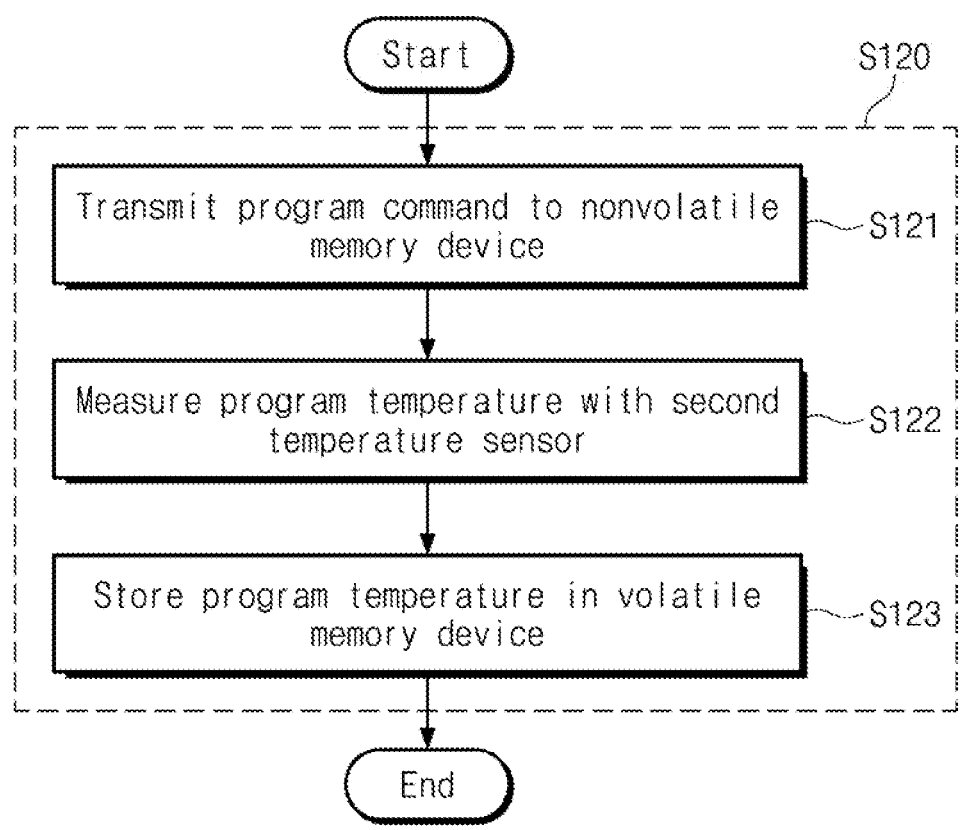
FIG. 9 is a flowchart illustrating operation S120 of FIG. 8 in detail, according to an embodiment.

FIG. 9 is a flowchart illustrating operation S120 of FIG. 8 in detail, according to an embodiment. Referring to FIGS. 1 to 9, operation S120 may include operation S121 to operation S123.

In operation S121, the memory controller 120 may transmit a program command to the nonvolatile memory device 110. For example, the program command may be a command indicating the program operation for the first page of the nonvolatile memory device 110.

In operation S122, the memory controller 120 may measure the program temperature TPGM by using the second temperature sensor 121. For example, through the second temperature sensor 121, the memory controller 120 may measure the temperature of the nonvolatile memory device 110 while the program operation is performed on the first page.

In operation S123, the memory controller 120 may store the program temperature TPGM in the volatile memory device 130. In this case, the volatile memory device 130 may store the program temperature TPGM for each page. For example, the volatile memory device 130 may store the program temperature TPGM of the first page and the program temperature TPGM of the second page independently of each other.

In an embodiment, the order of performing operation S121 to operation S123 may be changed. For example, operation S121 may be performed after operation S122 or operation S123. That is, the present disclosure is not limited to the order of performing operation S121 to operation S123.

Figure 10:
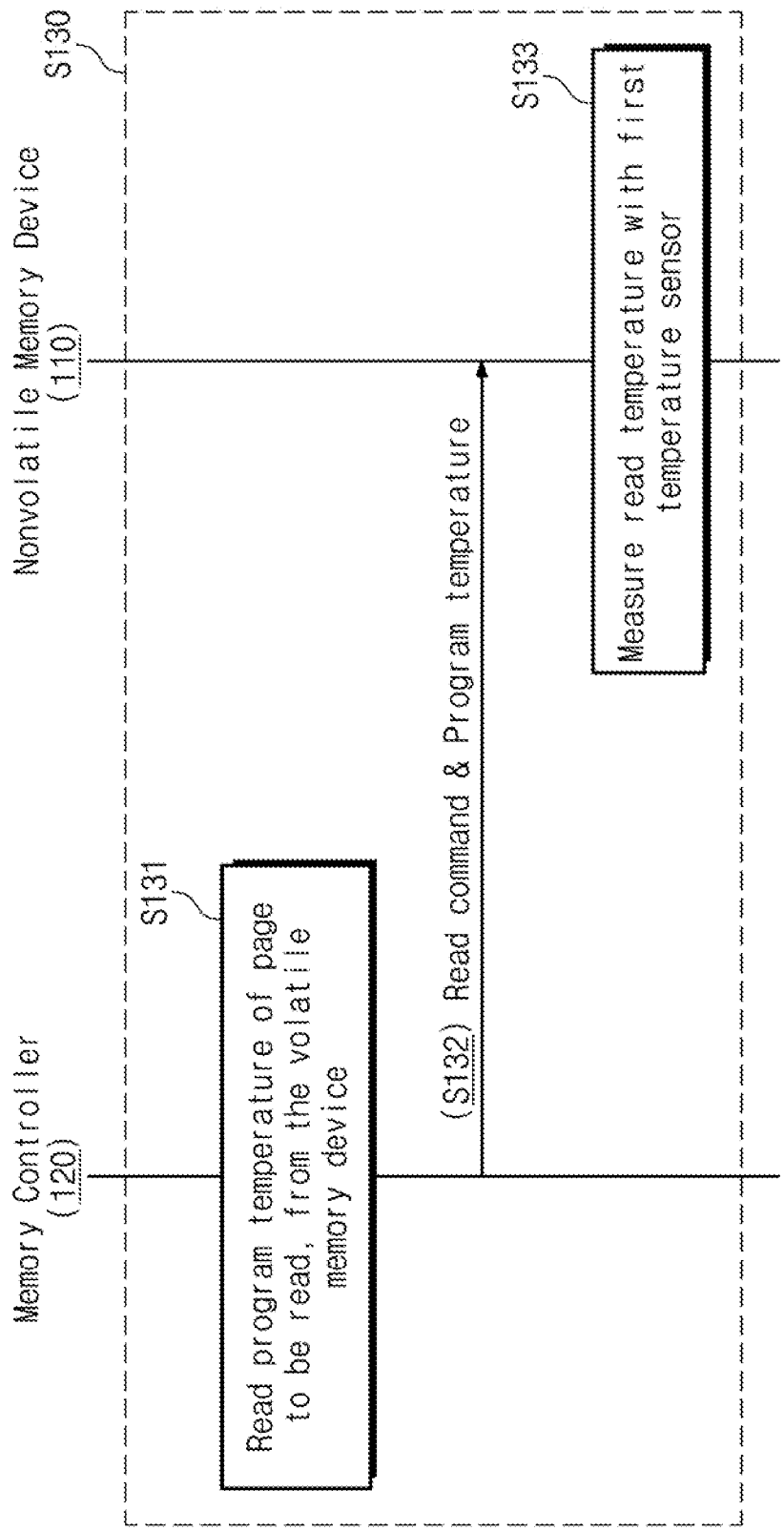
FIG. 10 is a flowchart illustrating operation S130 of FIG. 8 in detail, according to an embodiment.

FIG. 10 is a flowchart illustrating operation S130 of FIG. 8 in detail, according to an embodiment. Referring to FIGS. 1 to 10, operation S130 may include operation S131 to operation S133.

In operation S131, the memory controller 120 may read the program temperature TPGM of a page targeted for the read operation from the volatile memory device 130. For example, when the memory controller 120 reads data of the first page from the nonvolatile memory device 110, the memory controller 120 may read the program temperature TPGM of the first page from the volatile memory device 130 before transmitting the read command for the first page to the nonvolatile memory device 110.

In operation S132, the memory controller 120 may transmit the read program temperature TPGM and the read command to the nonvolatile memory device 110. For example, the memory controller 120 may transmit the read command for the first page and the program temperature TPGM of the first page to the nonvolatile memory device 110. In an embodiment, the program temperature TPGM of the first page may be included in a command sequence of the read command for the first page.

In operation S133, the nonvolatile memory device 110 may measure the read temperature TRD by using the first temperature sensor 111. That is, in response to the read command for the first page, the nonvolatile memory device 110 may measure the read temperature of the nonvolatile memory device 110 by using the first temperature sensor 111. In this case, the measured read temperature may refer to the read temperature TRD of the first page.

Figure 11:
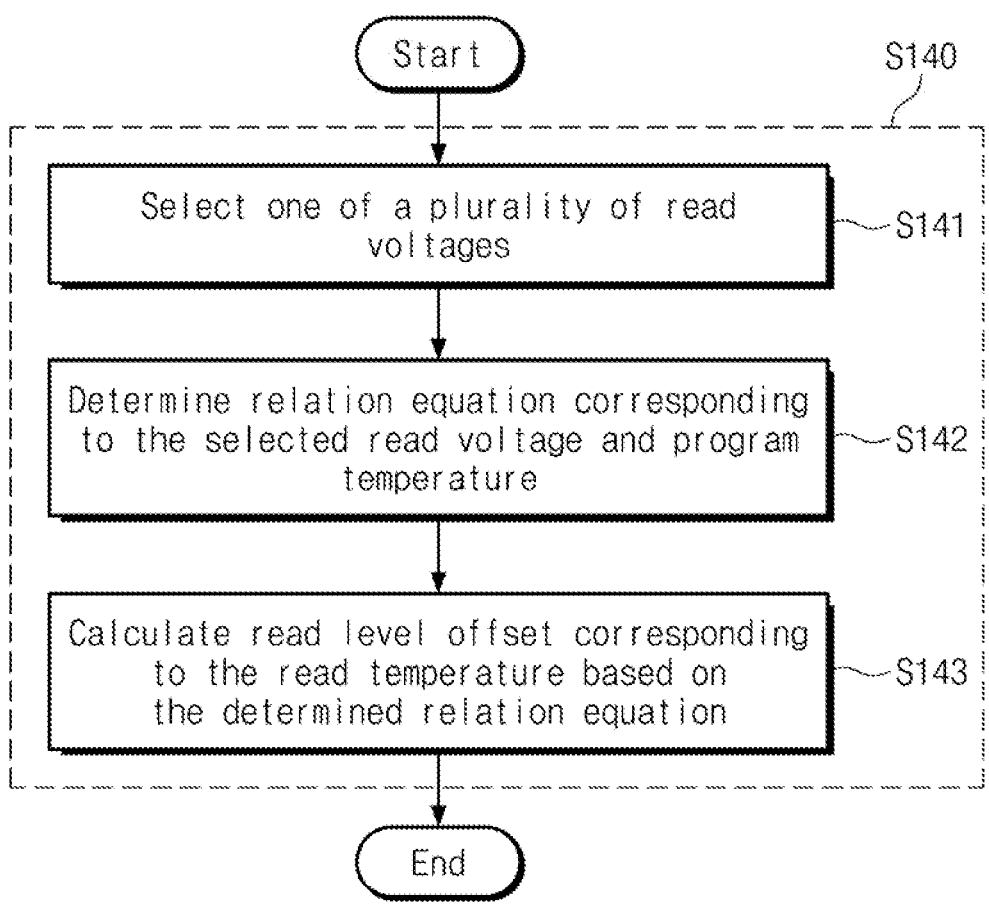
FIG. 11 is a flowchart illustrating operation S140 of FIG. 8 in detail, according to an embodiment.

FIG. 11 is a flowchart illustrating operation S140 of FIG. 8 in detail, according to an embodiment. Referring to FIGS. 1 to 11, operation S140 may include operation S141 to operation S143.

In operation S141, the nonvolatile memory device 110 may select one of a plurality of read voltages. For example, the control logic circuit 115 may select one of a plurality of read voltages defined in advance. The selected read voltage may refer to the selected read voltage VRD. The control logic circuit 115 may provide the temperature compensation circuit 112 with the selected read voltage signal Sig_VRD corresponding to the selected read voltage VRD.

In an embodiment, the selected read voltage signal Sig_VRD may include an identifier of the selected read voltage VRD.

In operation S142, the nonvolatile memory device 110 may determine a relation equation corresponding to the selected read voltage VRD and the program temperature TPGM. For example, the temperature compensation circuit 112 may determine a relation equation corresponding to the selected read voltage VRD and the program temperature TPGM of the first page from among the plurality of relation equations modeled in operation S110.

In operation S143, the nonvolatile memory device 110 may calculate the read level offset RLO corresponding to the read temperature TRD, based on the determined relation equation. For example, the temperature compensation circuit 112 may calculate the read level offset RLO of the first page by substituting the read temperature TRD of the first page into the relation equation determined in operation S142.

Figure 12:
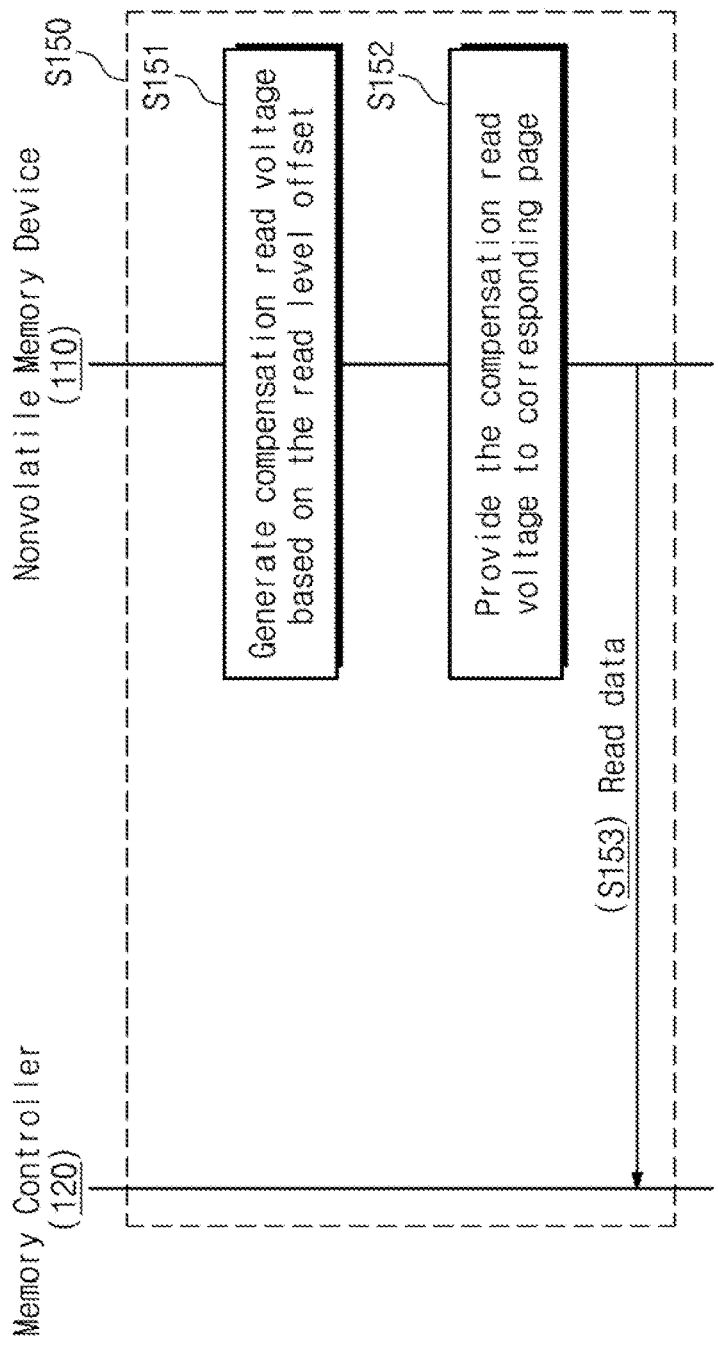
FIG. 12 is a flowchart illustrating operation S150 of FIG. 8 in detail, according to an embodiment.

FIG. 12 is a flowchart illustrating operation S150 of FIG. 8 in detail, according to an embodiment. Referring to FIGS. 1 to 12, operation S150 may include operation S151 to operation S153.

In operation S151, the nonvolatile memory device 110 may generate the compensation read voltage VRD_COM based on the read level offset RLO. For example, the temperature compensation circuit 112 may generate the compensation read voltage VRD_COM corresponding to a sum of the read level offset RLO and the selected read voltage VRD.

In operation S152, the nonvolatile memory device 110 may provide the compensation read voltage VRD_COM to a relevant page. For example, the temperature compensation circuit 112 may provide the compensation read voltage VRD_COM to the first page. In detail, the temperature compensation circuit 112 may provide the compensation read voltage VRD_COM to a first word line (i.e., the selected word line) connected to memory cells of the first page through the address decoder 114.

In operation S153, the nonvolatile memory device 110 may return the read data to the memory controller 120. For example, the read data may be data of the first page.

In an embodiment, the nonvolatile memory device 110 may select a read voltage different from the read voltage selected in operation S141 between operation S152 and operation S153, and may further perform operation S142 to operation S143 and operation S151 and operation S152 described above. That is, the present disclosure is not limited to the number of different compensation read voltages that are sequentially provided to the selected word line in response to the read command.

Figure 13:
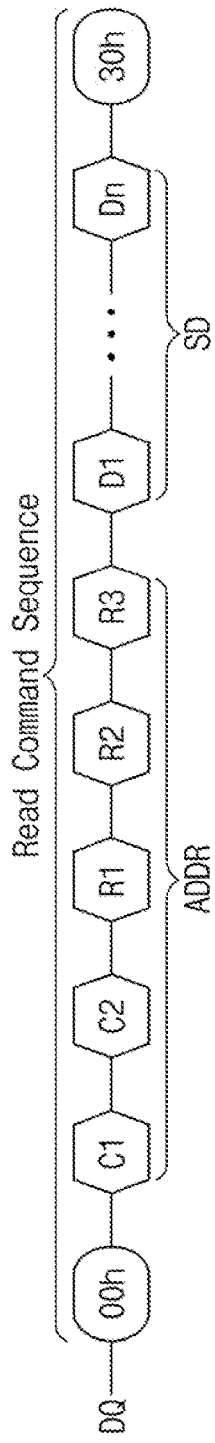
FIG. 13 is diagram illustrating a command sequence of a read command, according to an embodiment.

FIG. 13 illustrates a command sequence of a read command, according to an embodiment. Below; a command sequence for the read command transmitted through the DQ pins of the nonvolatile memory device 110 will be described with reference to FIG. 13. However, the present disclosure is not limited thereto.

Referring to FIGS. 1 and 13, the read command sequence may be determined based on a "00h" command and a "30h" command that are transmitted from the memory controller 120 to the nonvolatile memory device 110 through the DQ pins. For example, the read command sequence may start from a point in time when the "00h" command is provided from the memory controller 120 to the nonvolatile memory device 110, and may end at a point in time when the "30" h command is provided from the memory controller 120 to the nonvolatile memory device 110.

The address ADDR may be included between the "00h" command and the "30h" command. For example, the address ADDR may refer to an address of the nonvolatile memory device 110, which corresponds to the command CMD of FIG. 1. The address ADDR may include first and second column addresses C1 and C2 and first to third row addresses RI to R3.

In an embodiment, sub-data SD may be included between the "00h" command and the "30h" command. The sub-data SD may refer to subsidiary information that is not the command CMD and the address ADDR of FIG. 1. For example, the sub-data SD may include first to n-th data D1 to Dn. In this case, at least some of the first to n-th data D1 to Dn may include information corresponding to the program temperature TPGM of FIG. 1.

That is, according to an embodiment, the command sequence of the read command for the first page may include an address of the first page and a program temperature of the first page.

Figure 14:
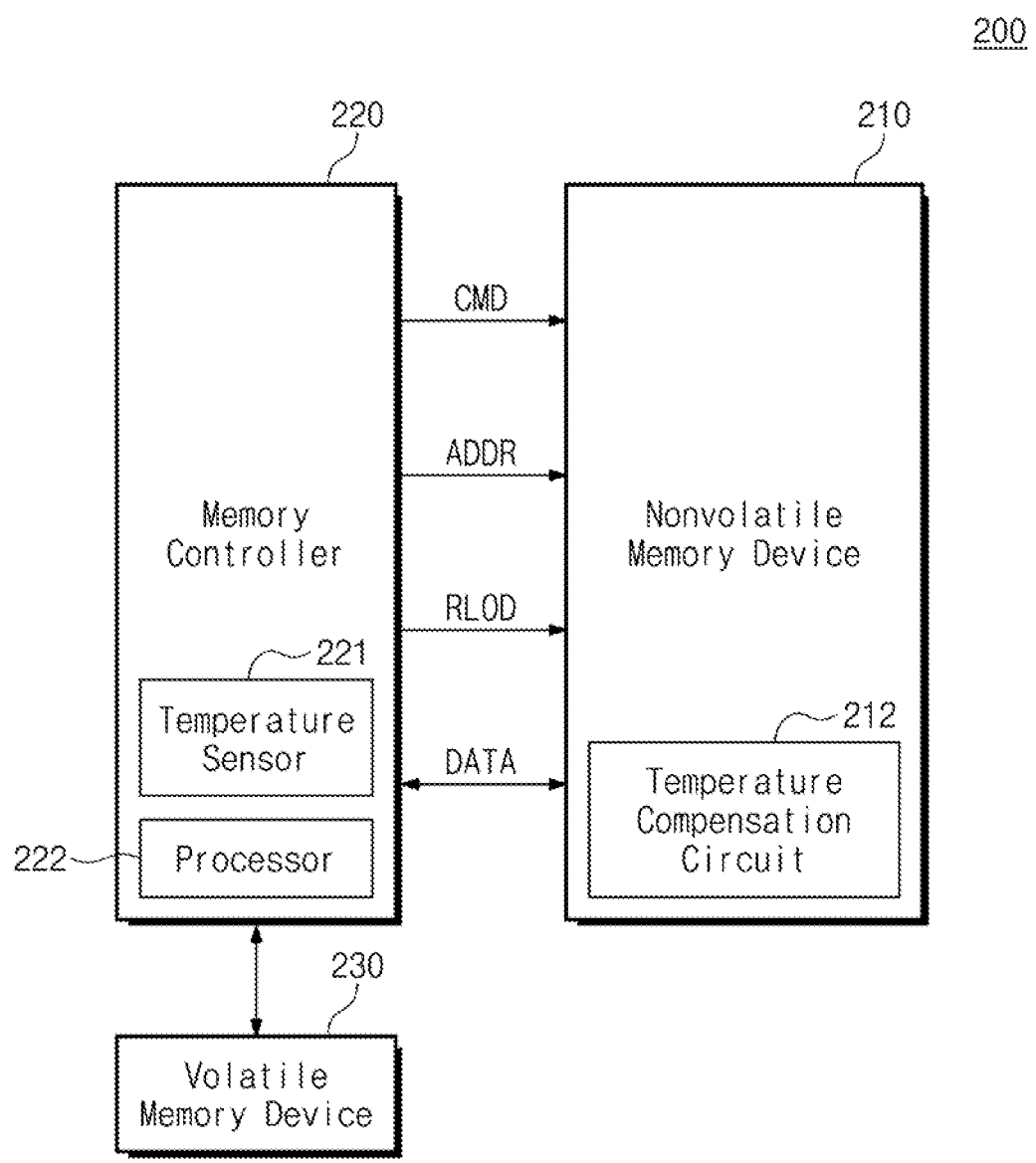
FIG. 14 is a block diagram illustrating a storage device, according to an embodiment.

FIG. 14 is a block diagram illustrating a storage device, according to an embodiment. Referring to FIG. 14, a storage device 200 may include a nonvolatile memory device 210, a memory controller 220, and a volatile memory device 230. The memory controller 220 may transmit the command CMD and the address ADDR to the nonvolatile memory device 210 for the purpose of storing the data DATA in the nonvolatile memory device 210 or reading the data DATA stored in the nonvolatile memory device 210. Functions of the nonvolatile memory device 210, the memory controller 220, and the volatile memory device 230 are similar to the functions of the nonvolatile memory device 110, the memory controller 120, and the volatile memory device 130 described with reference to FIG. 1, and thus, duplicate description will be omitted to avoid redundancy.

The memory controller 220 may include a temperature sensor 221. The temperature sensor 221 may measure a temperature of the nonvolatile memory device 210. In detail, the temperature sensor 221 may measure a program temperature of the nonvolatile memory device 210. In this case, the program temperature may refer to a temperature of the nonvolatile memory device 210 while the program operation is performed on the nonvolatile memory device 210. Also, the temperature sensor 221 may measure a read temperature of the nonvolatile memory device 210. In this case, the read temperature may refer to a temperature of the nonvolatile memory device 210 while the read operation is performed on the nonvolatile memory device 210.

In an embodiment, the memory controller 220 may store the program temperature in the volatile memory device 230.

The memory controller 220 may include a processor 222. The processor 222 may identify read voltages to be provided to a page to be read. For example, when the memory controller 220 performs the read operation for the first page of the nonvolatile memory device 210, the processor 222 may identify read voltages to be provided to the first page.

The processor 222 may calculates a plurality of read level offsets based on the identified read voltages. For example, as in the operation of the temperature compensation circuit 112 described with reference to FIGS. 3 to 8, the processor 222 may calculate the plurality of read level offsets based on a plurality of relation equations, each of which is modeled based on each pair of a read voltage and a program temperature.

That is, the processor 222 may calculate the plurality of read level offsets based on the plurality of relation equations corresponding to the measured program temperature of the first page and the identified read voltages. In detail, the processor 222 may calculate the first read level offset by substituting the measured read temperature of the first page into the first relation equation corresponding to the measured program temperature of the first page and the identified first read voltage. In detail, the processor 222 may calculate the second read level offset by substituting the measured read temperature of the first page into the second relation equation corresponding to the measured program temperature of the first page and the identified second read voltage. However, the present disclosure is not limited to the number of identified read voltages.

The processor 222 may generate read level offset data RLOD based on the plurality of read level offsets. In this case, the read level offset data RLOD may include the plurality of read level offsets respectively corresponding to the plurality of read voltages for the page where the read operation is to be performed. The processor 222 may provide the read level offset data RLOD to the nonvolatile memory device 210.

In an embodiment, the read level offset data RLOD may be included in the command sequence of the read command CMD.

The nonvolatile memory device 210 may include a temperature compensation circuit 212. The temperature compensation circuit 212 may generate compensation read voltages based on the read level offset data RLOD. For example, the temperature compensation circuit 212 may generate the compensation read voltages based on the plurality of read level offsets included in the read level offset data RLOD. The temperature compensation circuit 212 may provide the compensation read voltages to the selected word line. A function and an operation of the temperature compensation circuit 212 will be described in detail with reference to FIGS. 15 to 19.

In an embodiment, the memory controller 220 may include components that respectively correspond to the SRAM 123, the host device interface 124, the volatile memory device interface 125, and the nonvolatile memory device interface 126 described with reference to FIG. 2.

Figure 15:
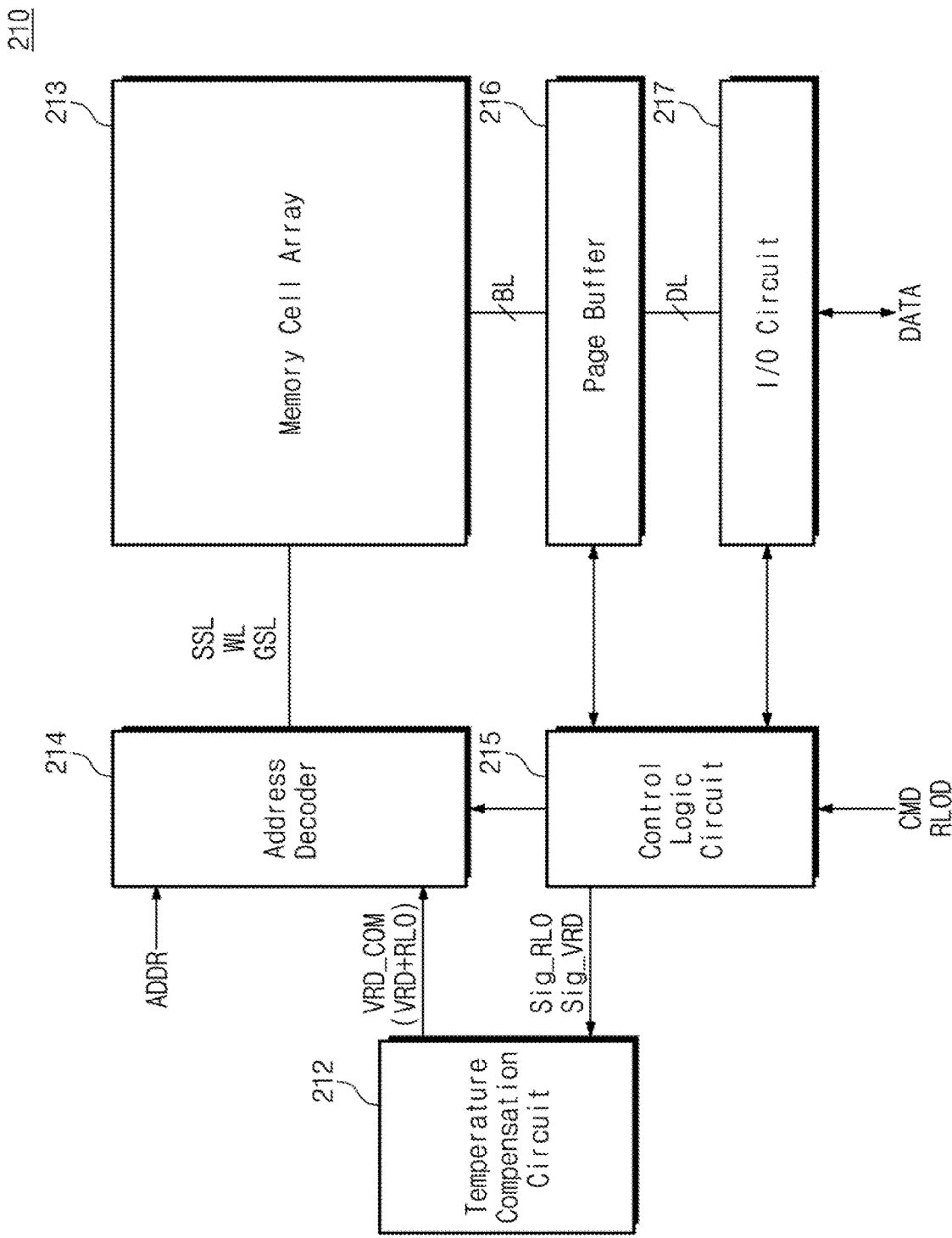
FIG. 15 is a block diagram illustrating a nonvolatile memory device of FIG. 14, according to an embodiment.

FIG. 15 is a block diagram illustrating a nonvolatile memory device of FIG. 14. Referring to FIGS. 3, 14, and 15, the nonvolatile memory device 210 may include the temperature compensation circuit 212, a memory cell array 213, an address decoder 214, a control logic circuit 215, a page buffer 216, and an input/output circuit 217. Configurations and functions of the memory cell array 213, the address decoder 214, the page buffer 216, and the input/output circuit 217 are similar to those described with reference to FIG. 3, and thus, duplicate description will be omitted to avoid redundancy.

The control logic circuit 215 may receive the command CMD from the memory controller 220. The control logic circuit 215 may control an overall operation of the nonvolatile memory device 210 based on the received command CMD. Below, an embodiment in which the received command CMD is the read command will be described in detail.

The control logic circuit 215 may receive the read command from the memory controller 120. In this case, the control logic circuit 215 may receive the read level offset data RLOD corresponding to the received read command from the memory controller 220. For example, when the control logic circuit 215 receives the read command for the first page, the control logic circuit 215 may receive the read level offset data RLOD of the first page from the memory controller 220.

The control logic circuit 215 may select one of a plurality of read voltages for the read operation of the first page. The selected read voltage may refer to the selected read voltage VRD. The control logic circuit 215 may provide the temperature compensation circuit 212 with the selected read voltage signal Sig_VRD corresponding to the selected read voltage VRD.

The control logic circuit 215 may provide the temperature compensation circuit 212 with a read level offset signal Sig_RLO corresponding to the selected read voltage VRD. In this case, the read level offset signal Sig_RLO may refer to the read level offset RLO corresponding to the selected read voltage VRD from among the plurality of read level offsets included in the read level offset data RLOD. For example, the read level offset signal Sig_RLO may include an identifier of the read level offset RLO corresponding to the selected read voltage VRD.

The temperature compensation circuit 212 may generate the compensation read voltage VRD_COM corresponding to the selected read voltage VRD in response to the selected read voltage signal Sig_VRD and the read level offset signal Sig_RLO. In this case, the compensation read voltage VRD_COM may be determined as a sum of the selected read voltage VRD and the read level offset RLO corresponding thereto.

The selected read voltage signal Sig_VRD is similar to that described with reference to FIG. 3, and the read operation based on the compensation read voltage VRD_COM is similar to that described with reference to FIGS. 1 to 13. Thus, duplicate description will be omitted to avoid redundancy.

According to the embodiment of FIG. 15, unlike the embodiment described with reference to FIGS. 1 to 12, the read level offset RLO corresponding to the program temperature TPGM and the read temperature TRD may be calculated by the memory controller 220. However, even in this case, the read level offset may be calculated within the memory controller 220, instead of determining the read level offset through the temperature bump table (TBT) stored in the internal SRAM of the memory controller 220. In this case, the size of data that are stored in the internal SRAM of the memory controller 220 may decrease.

Figure 16:
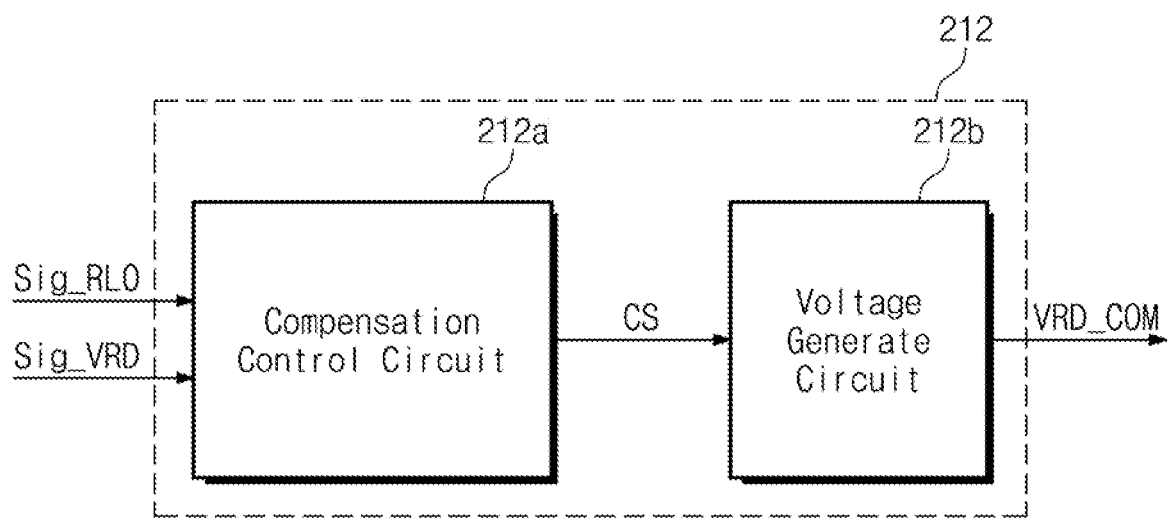
FIG. 16 is a block diagram illustrating a temperature compensation circuit of FIG. 15 in detail, according to an embodiment.

FIG. 16 is a block diagram illustrating a temperature compensation circuit of FIG. 15 in detail, according to an embodiment. Referring to FIGS. 14 to 16, the temperature compensation circuit 212 may include a compensation control circuit 212a and a voltage generate circuit 212b.

The compensation control circuit 212a may receive the selected read voltage signal Sig_VRD and the read level offset signal Sig_RLO from the control logic circuit 215. The compensation control circuit 212a may determine the voltage level of the compensation read voltage VRD_COM based on the selected read voltage signal Sig_VRD and the read level offset signal Sig_RLO. That is, the compensation control circuit 212a may provide the control signal CS to the voltage generate circuit 212b.

Figure 17:
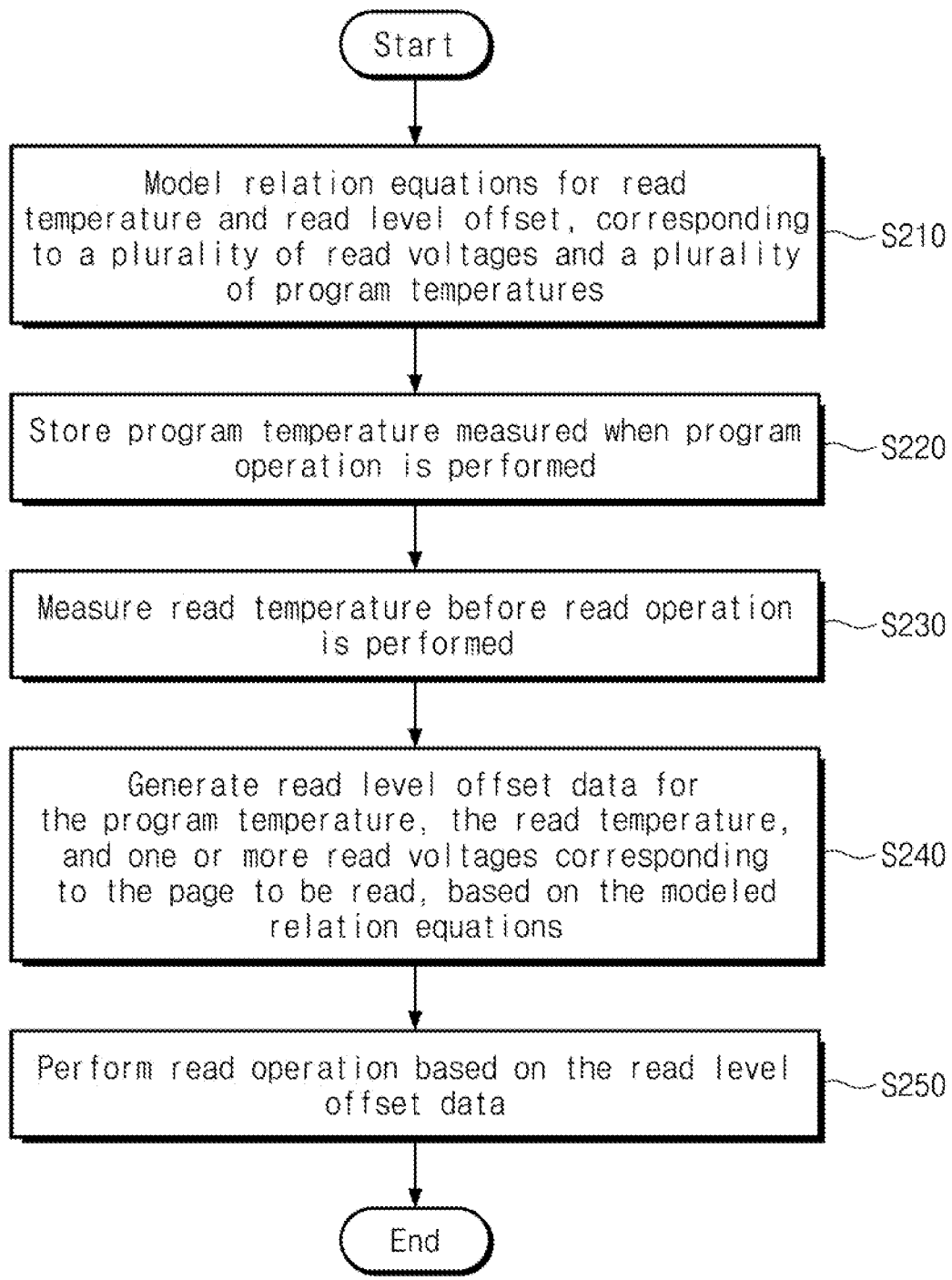
FIG. 17 is a flowchart illustrating an operation method of a storage device of FIG. 14, according to an embodiment.

The voltage generate circuit 212b may generate the compensation read voltage VRD_COM corresponding to a sum of the selected read voltage VRD corresponding to the selected read voltage signal Sig_VRD and the read level offset RLO corresponding to the read level offset signal Sig_RLO, in response to the control signal CS. The operation of the voltage generate circuit 212b is similar to the operation of the voltage generate circuit 112b described with reference to FIG. 7, and thus, duplicate description will be omitted to avoid redundancy. FIG. 17 is a flowchart illustrating an operation method of a storage device of FIG. 14, according to an embodiment. Referring to FIGS. 14 to 17, in operation S210, the storage device 200 may model a plurality of relation equations for a read temperature and a read level offset, which respectively correspond to a plurality of read voltages and a plurality of program temperatures.

In operation S220, the storage device 200 may measure a program temperature when the program operation is performed. For example, when the program operation is performed on the first page, the memory controller 220 may measure a temperature of the nonvolatile memory device 210 by using the temperature sensor 221. In this case, the measured temperature may refer to the program temperature.

Operation S210 and operation S220 are similar to operation S110 and operation S120, respectively, described with reference to FIGS. 8 and 9, and thus, duplicate description will be omitted to avoid redundancy.

In operation S230, the storage device 200 may measure a read temperature before the read operation is performed. For example, before the read operation is performed on the first page (i.e., before the memory controller 220 provides the read command for the first page to the nonvolatile memory device 210), the memory controller 220 may measure the temperature of the nonvolatile memory device 210 by using the temperature sensor 221. In this case, the measured temperature may refer to the read temperature.

In operation S240, the storage device 200 may generate the read level offset data RLOD, which are associated with a read temperature, a program temperature, and one or more read voltages corresponding to a page to be read, based on the modeled relation equations. In this case, the read level offset data RLOD may include the plurality of read level offsets, each of which corresponds to the program temperature, the read temperature, and each of the one or more read voltages corresponding to the page to be read. How the memory controller 220 generates the read level offset data RLOD will be described in detail with reference to FIG. 18.

In operation S250, the storage device 200 may perform the read operation based on the read level offset data RLOD thus determined. For example, the temperature compensation circuit 212 may generate a plurality of compensation read voltages based on the plurality of read level offsets included in the read level offset data RLOD. The temperature compensation circuit 212 may sequentially provide the generated compensation read voltages to the selected word line through the address decoder 214. How the plurality of compensation read voltages are provided to the selected word line will be described in detail with reference to FIG. 19.

Figure 18:
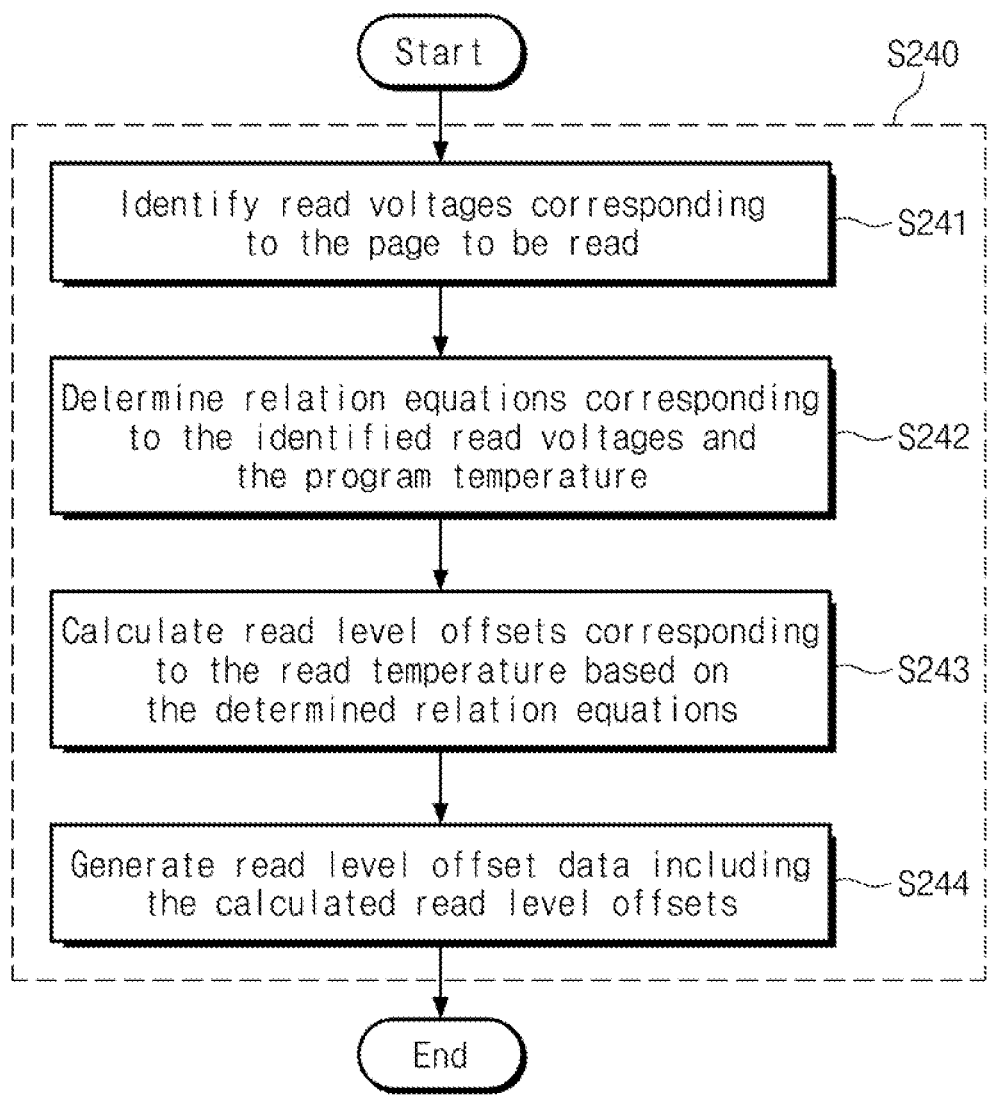
FIG. 18 is a flowchart illustrating operation S240 of FIG. 17 in detail, according to an embodiment.

FIG. 18 is a flowchart illustrating operation S240 of FIG. 17 in detail, according to an embodiment. Referring to FIGS. 14 to 18, operation S240 may include operation S241 to operation S244. Below; an operation that is performed before the memory controller 220 issues the read command for the first page will be described representatively.

In operation S241, the memory controller 220 may identify read voltages corresponding to a page to be read. For example, the processor 222 may identify a plurality of read voltages to be used in the nonvolatile memory device 210 to read the first page.

In operation S242, the memory controller 220 may determine relation equations corresponding to the identified read voltages and the program temperature. For example, the processor 222 may determine a plurality of relation equations, each of which corresponds to the program temperature measured in operation S220 and each of the plurality of read voltages identified in operation S241.

In operation S243, the memory controller 220 may calculate a plurality of read level offsets respectively corresponding to the plurality of read voltages based on the determined relation equations. For example, the processor 222 may calculate the plurality of read level offsets by substituting the read temperature measured in operation S230 into each of the plurality of relation equations determined in operation S242.

In operation S244, the memory controller 220 may generate the read level offset data RLOD including the calculated read level offsets. The read level offset data RLOD thus generated may be provided to the nonvolatile memory device 210 together with the read command.

Figure 19:
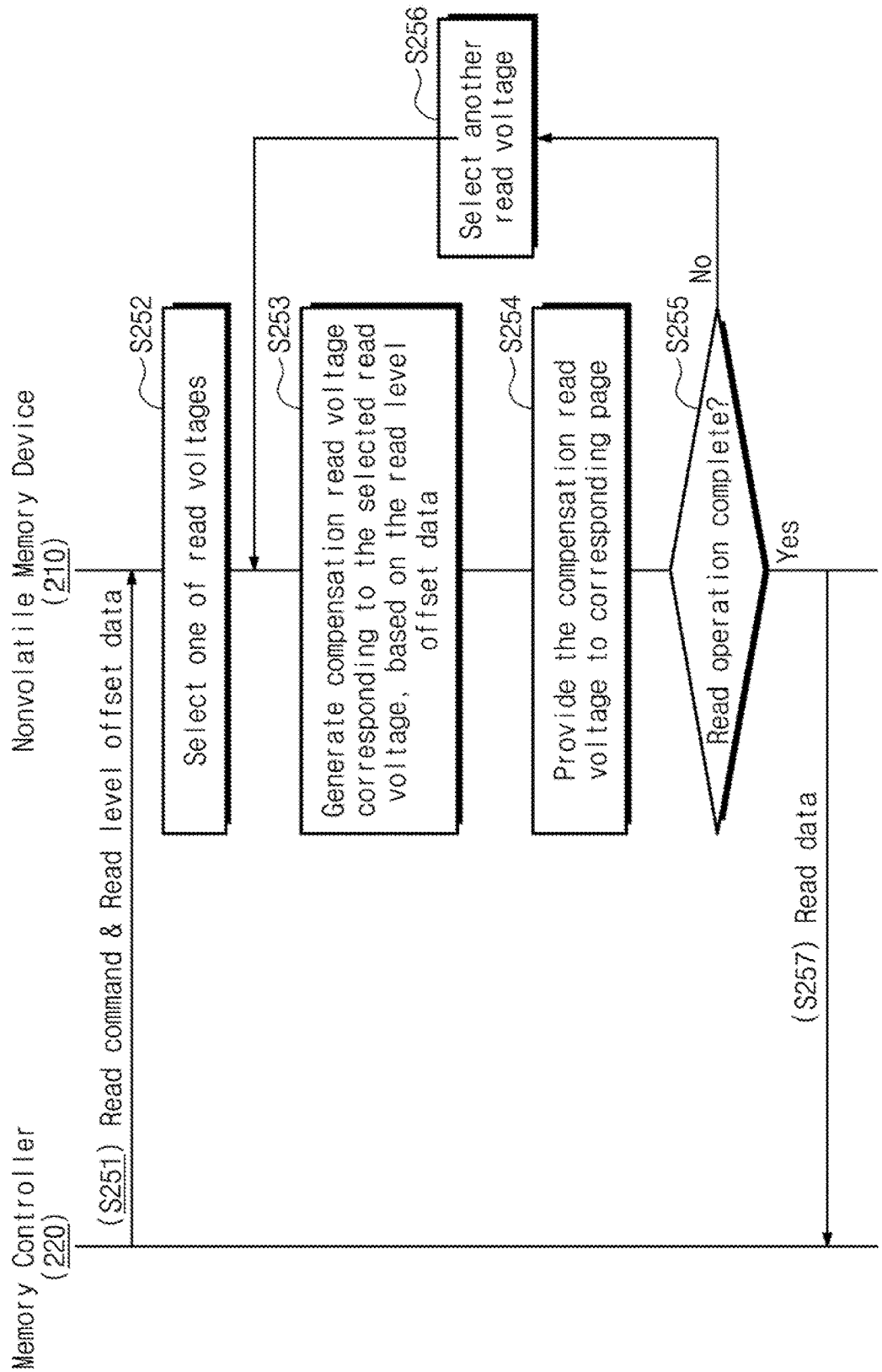
FIG. 19 is a flowchart illustrating operation S250 of FIG. 17 in detail, according to an embodiment.

FIG. 19 is a flowchart illustrating operation S250 of FIG. 17 in detail. Referring to FIGS. 14 to 19, operation S250 may include operation S251 to operation S257.

In operation S251, the memory controller 220 may transmit the read command and the read level offset data RLOD to the nonvolatile memory device 210. For brief description, below; it is assumed that the read command transmitted in operation S251 is the read command for the first page.

In an embodiment, as in the description given with reference to FIG. 13, the read level offset data RLOD may be included in a command sequence of the read command.

In operation S252, the nonvolatile memory device 210 may select one of a plurality of read voltages. For example, the control logic circuit 215 may select one of the plurality of read voltages for reading the first page. In this case, the selected read voltage may refer to the selected read voltage VRD.

In operation S253, the nonvolatile memory device 210 may generate the compensation read voltage VRD_COM corresponding to the selected read voltage VRD based on the read level offset data RLOD. For example, the control logic circuit 215 may determine a read level offset corresponding to the selected read voltage VRD from among the plurality of read level offsets included in the read level offset data RLOD. The control logic circuit 215 may provide the temperature compensation circuit 212 with the read level offset signal Sig_RLO for the determined read level offset and the selected read voltage signal Sig_VRD. In this case, the temperature compensation circuit 212 may generate the compensation read voltage VRD_COM based on the selected read voltage VRD and the read level offset RLO corresponding thereto.

In operation S254, the nonvolatile memory device 210 may provide the compensation read voltage VRD_COM to a relevant page. For example, the temperature compensation circuit 212 may provide the compensation read voltage VRD_COM to the first page. In detail, the temperature compensation circuit 212 may provide the compensation read voltage VRD_COM to a first word line (i.e., the selected word line) connected to memory cells of the first page through the address decoder 214.

In operation S255, the nonvolatile memory device 210 may determine whether the read operation is completed. For example, the control logic circuit 215 may determine whether compensation read voltages respectively corresponding to all the read voltages for determining program states of the memory cells of the first page are provided to the selected word line. When it is determined in operation S255 that compensation read voltages corresponding to some of the read voltages are not provided to the selected word line, operation S256 may be performed. When it is determined in operation S255 that the compensation read voltages respectively corresponding to all the read voltages are provided to the selected word line, operation S257 may be performed.

In operation S256, the nonvolatile memory device 210 may select another read voltage. For example, the control logic circuit 215 may select one new read voltage among the plurality of read voltages for reading the first page. In this case, the newly selected read voltage may refer to the selected read voltage VRD. Afterwards, the nonvolatile memory device 210 may perform operation S253 to operation S255.

In operation S257, the nonvolatile memory device 210 may return the read data to the memory controller 220. For example, the read data may be data of the first page.

Figure 20:
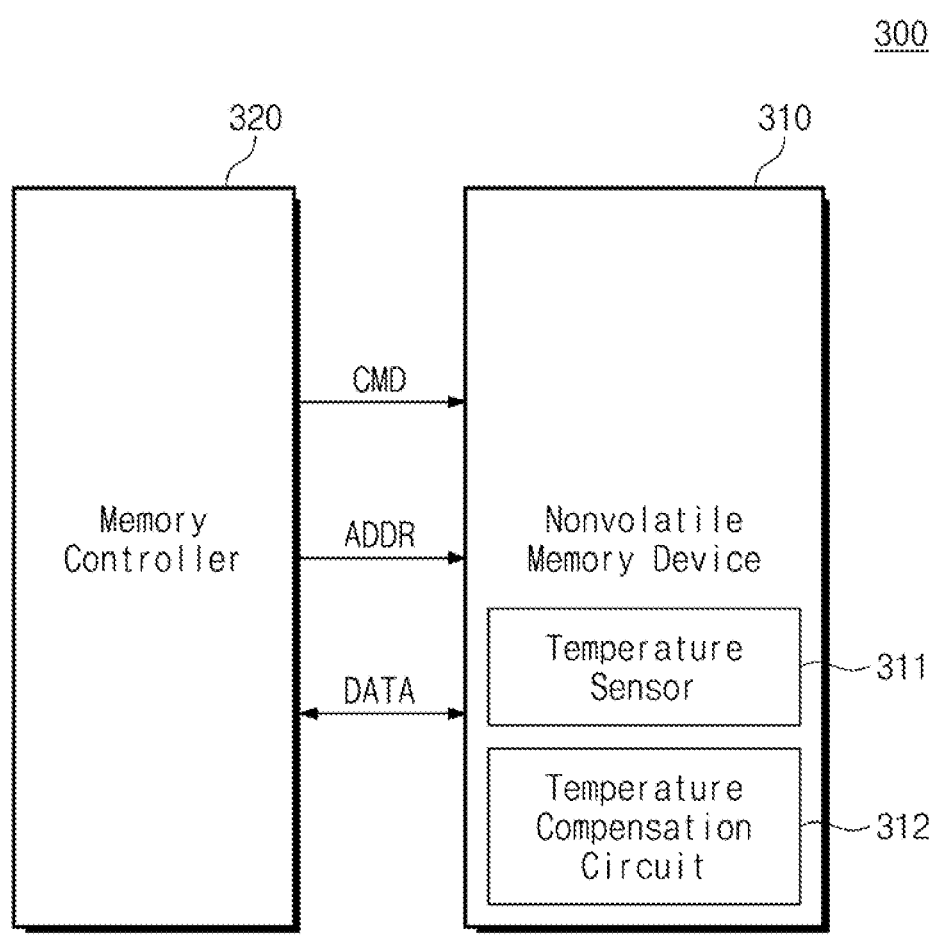
FIG. 20 is a block diagram illustrating a storage device according to an embodiment.

FIG. 20 is a block diagram illustrating a storage device, according to an embodiment. Referring to FIG. 20, a storage device 300 may include a nonvolatile memory device 310 and a memory controller 320. The memory controller 320 may transmit the command CMD and the address ADDR to the nonvolatile memory device 310 for the purpose of storing the data DATA in the nonvolatile memory device 310 or reading the data DATA stored in the nonvolatile memory device 310. Functions of the nonvolatile memory device 310 and the memory controller 320 are similar to the functions of the nonvolatile memory device 110 and the memory controller 120 described with reference to FIG. 1, and thus, duplicate description will be omitted to avoid redundancy.

The nonvolatile memory device 310 may include a temperature sensor 311. The temperature sensor 311 may measure a temperature of the nonvolatile memory device 310. In detail, the temperature sensor 311 may measure a program temperature and a read temperature of the nonvolatile memory device 310. A function of the temperature sensor 311 is similar to that described with reference to FIG. 14, and thus, duplicate description will be omitted to avoid redundancy.

The nonvolatile memory device 310 may include a temperature compensation circuit 312. A function of the temperature compensation circuit 312 is similar to the function of the temperature compensation circuit 112 described with reference to FIGS. 1 to 13, and thus, duplicate description will be omitted to avoid redundancy.

Figure 21:
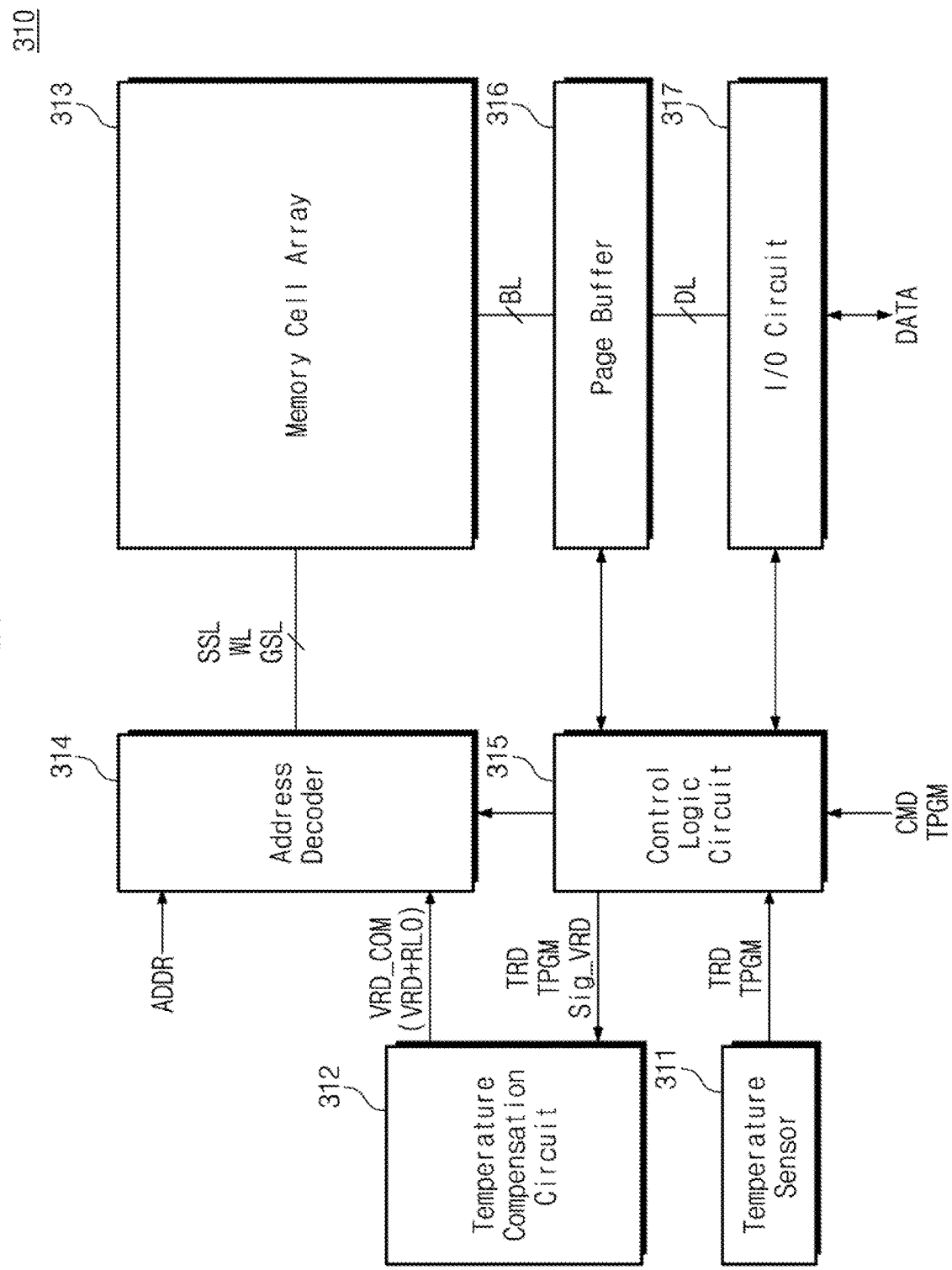
FIG. 21 is a block diagram illustrating a nonvolatile memory device of FIG. 20, according to an embodiment.

FIG. 21 is a block diagram illustrating a nonvolatile memory device of FIG. 20. Referring to FIGS. 20 and 21, the nonvolatile memory device 310 may include the temperature sensor 311, the temperature compensation circuit 312, a memory cell array 313, an address decoder 314, a control logic circuit 315, a page buffer 316, and an input/output circuit 317. Configurations and functions of the memory cell array 313, the address decoder 314, the page buffer 316, and the input/output circuit 317 are similar to those described with reference to FIG. 3, and thus, duplicate description will be omitted to avoid redundancy.

The control logic circuit 315 may receive the program command from the memory controller 320. For example, the control logic circuit 315 may receive the program command for the first page from the memory controller 320. In this case, the control logic circuit 315 may measure the program temperature TPGM of the first page by using the temperature sensor 311. The control logic circuit 315 may store the measured program temperature TPGM in the nonvolatile memory device 310.

In an embodiment, the measured program temperature TPGM may be stored in the memory cell array 313. However, the present disclosure is not limited thereto.

The control logic circuit 315 may receive the read command from the memory controller 320. For example, the control logic circuit 315 may receive the read command for the first page from the memory controller 320. In this case, the control logic circuit 315 may measure the read temperature TRD of the first page by using the temperature sensor 311.

The control logic circuit 315 may provide the temperature compensation circuit 312 with the program temperature TPGM, the read temperature TRD, and the selected read voltage signal Sig_VRD. As in the operation of the temperature compensation circuit 112 described with reference to FIG. 1, the temperature compensation circuit 312 may operate based on the program temperature TPGM, the read temperature TRD, and the selected read voltage signal Sig_VRD.

As described above, a nonvolatile memory device and a method thereof according to embodiments are provided, in which a read voltage varies depending on a program temperature at a point in time when a program operation is performed and a read temperature at a point in time when a read operation is performed.

In the above embodiments, a temperature compensation circuit is included in a nonvolatile memory to calculate a read level offset and generate a compensated read voltage. However, the disclosure is not limited thereto. According to an embodiment, the temperature compensation circuit may be included in a memory controller connected to the nonvolatile memory device, and the memory controller may transmit a command including the calculated compensated read voltage to the nonvolatile memory device.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A nonvolatile memory device comprising:
   a memory cell array comprising a plurality of memory cells connected to a plurality of word lines;
   an address decoder configured to control a selected word line among the plurality of word lines, based on an address received from an external device comprising a first temperature sensor;
   a second temperature sensor configured to measure a read temperature of first memory cells connected to the selected word line from among the plurality of memory cells; and
   a temperature compensation circuit configured to calculate a read level offset based on the read temperature and a program temperature of the first memory cells measured by the first temperature sensor, and to generate a compensation read voltage based on the read level offset,
   wherein the address decoder is further configured to provide the compensation read voltage to the selected word line.

2. The nonvolatile memory device of claim 1, wherein the program temperature is a temperature of the nonvolatile memory device at a first point in time when a program operation is performed on the first memory cells, and
   wherein the read temperature is a temperature of the nonvolatile memory device at a second point in time when a read operation is performed on the first memory cells.

3. The nonvolatile memory device of claim 1, wherein the temperature compensation circuit comprises:
   a compensation calculate circuit configured to calculate the read level offset based on the read temperature and the program temperature; and
   a voltage generate circuit configured to generate the compensation read voltage under control of the compensation calculate circuit.

4. The nonvolatile memory device of claim 3, wherein the compensation read voltage is a sum of a selected read voltage and the read level offset.

5. The nonvolatile memory device of claim 3, wherein the compensation calculate circuit is configured to calculate the read level offset based on a relation equation modeled with regard to the program temperature.

6. The nonvolatile memory device of claim 5, wherein the relation equation is a linear equation of the read temperature and the read level offset.

7. The nonvolatile memory device of claim 1, wherein, when the program temperature is a first temperature and the read temperature is a second temperature, the read level offset is a first voltage, and
   wherein, when the program temperature is the first temperature and the read temperature is a third temperature higher than the second temperature, the read level offset is a second voltage higher than the first voltage.

8. The nonvolatile memory device of claim 1, wherein, when the read temperature is a first temperature and the program temperature is a second temperature, the read level offset is a first voltage, and
   wherein, when the read temperature is the first temperature and the program temperature is a third temperature higher than the second temperature, the read level offset is a second voltage lower than the first voltage.

9. The nonvolatile memory device of claim 1, wherein the program temperature is included in a command sequence of a read command received from the external device.

10. An operation method of a nonvolatile memory device which comprises a first temperature sensor, the method comprising:
    receiving, from an external device comprising a second temperature sensor, a read command for a first page and a program temperature of the first page measured by the second temperature sensor;
    measuring a read temperature of the first page by using the first temperature sensor in response to the read command;
    calculating a read level offset based on the program temperature and the read temperature;
    generating a compensation read voltage based on the read level offset; and
    performing a read operation on the first page based on the compensation read voltage.

11. The method of claim 10, wherein the program temperature is a temperature of the nonvolatile memory device at a first point in time when a program operation is performed on the first page, and
wherein the read temperature is a temperature of the nonvolatile memory device at a second point in time when the read operation is performed on the first page.

12. The method of claim 10, wherein the program temperature is included in a command sequence of the read command.

13. The method of claim 10, wherein the compensation read voltage is a sum of the read level offset and a selected read voltage.

14. The method of claim 13, wherein the calculating comprises:
determining a relation equation corresponding to the program temperature and the selected read voltage; and
calculating the read level offset corresponding to the selected read voltage based on the determined relation equation.

15. The method of claim 14, wherein the relation equation is a linear equation of the read temperature and the read level offset.

16. An operation method of a storage device which comprises a nonvolatile memory device comprising a first page, a volatile memory device, and a memory controller controlling the nonvolatile memory device and the volatile memory device, the method comprising:
storing, by the memory controller, a first program temperature in the volatile memory device when a program operation is performed on the first page;
transmitting, by the memory controller, a read command for the first page and the first program temperature to the nonvolatile memory device;
measuring, by the memory controller or the nonvolatile memory device, a first read temperature;
calculating, by the memory controller or the nonvolatile memory device, a first read level offset based on the first program temperature and the first read temperature; and
performing, at the nonvolatile memory device, a read operation on the first page based on the first read level offset.

17. The method of claim 16, wherein the first program temperature is a temperature of the nonvolatile memory device at a first point in time when the program operation is performed on the first page, and
wherein the first read temperature is a temperature of the nonvolatile memory device at a second point in time when the read operation is performed on the first page.

18. The method of claim 17, wherein the storing the first program temperature comprises:
transmitting, by the memory controller, a program command for the first page to the nonvolatile memory device;
measuring, by the memory controller or the nonvolatile memory device, the first program temperature; and
storing, by the memory controller, the first program temperature in the volatile memory device.

19. The method of claim 18, wherein the calculating the first read level offset comprises:
selecting, by the memory controller or the nonvolatile memory device, a first read voltage among a plurality of read voltages for the first page;
determining, by the memory controller or the nonvolatile memory device, a first relation equation corresponding to the first read voltage and the first program temperature; and
calculating, by the memory controller or the nonvolatile memory device, the first read level offset corresponding to the first read temperature based on the first relation equation.

20. The method of claim 19, wherein the performing the read operation comprises:
generating, by the memory controller or the nonvolatile memory device, a first compensation read voltage corresponding to the first read level offset and the first read voltage; and
providing, by the memory controller or the nonvolatile memory device, the first compensation read voltage to the first page.

* * * * *